(12) United States Patent
Hong et al.

(10) Patent No.: US 11,659,748 B2
(45) Date of Patent: May 23, 2023

(54) DISPLAY DEVICE INCLUDING A SHIELD ELECTRODE AT A SAME LEVEL OF THE FIRST ELECTRODE OF A LIGHT EMITTING ELEMENT

(71) Applicant: Samsung Display Co., Ltd., Yongin-si (KR)

(72) Inventors: Jung-Moo Hong, Seongnam-si (KR); Sanghyun Jun, Suwon-si (KR); Gyeongnam Bang, Seoul (KR); Seongjun Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 243 days.

(21) Appl. No.: 17/123,118

(22) Filed: Dec. 16, 2020

(65) Prior Publication Data

US 2021/0288126 A1 Sep. 16, 2021

(30) Foreign Application Priority Data

Mar. 11, 2020 (KR) .......................... 10-2020-0029917

(51) Int. Cl.
*H01L 29/08* (2006.01)

(52) U.S. Cl.
CPC ......... *H10K 59/131* (2023.02); *H10K 59/126* (2023.02); *H10K 59/1213* (2023.02)

(58) Field of Classification Search
CPC ............ H01L 27/3276; H01L 27/3262; H01L 27/3272
USPC ........................................................ 257/40
See application file for complete search history.

(56) References Cited

U.S. PATENT DOCUMENTS

| 10,008,513 | B2 | 6/2018 | Shishido |
| 10,312,309 | B2 | 6/2019 | Lin et al. |
| 2013/0010216 | A1 | 1/2013 | Kang et al. |
| 2016/0322387 | A1* | 11/2016 | Kim ................... H01L 27/1259 |
| 2019/0237533 | A1* | 8/2019 | Kim ................... G09G 3/3266 |
| 2021/0036070 | A1 | 2/2021 | Jeon et al. |

FOREIGN PATENT DOCUMENTS

| JP | 6418849 | 11/2018 |
| KR | 10-2018-0049005 | 5/2018 |
| KR | 10-2021-0016161 | 2/2021 |

\* cited by examiner

*Primary Examiner* — Phuc T Dang
(74) *Attorney, Agent, or Firm* — H.C. Park & Associates, PLC

(57) ABSTRACT

Disclosed is a display device including a transistor, a light emitting element disposed on the transistor and including a first electrode, a second electrode on the first electrode, and an emission layer between the first electrode and the second electrode, a data line spaced apart from the light emitting element, and a shield electrode disposed at a same level of the first electrode. When viewed in a plan view, the shield electrode overlaps the data line and extends along the data line.

19 Claims, 20 Drawing Sheets

DISPLAY DEVICE INCLUDING A SHIELD ELECTRODE AT A SAME LEVEL OF THE FIRST ELECTRODE OF A LIGHT EMITTING ELEMENT

CROSS-REFERENCE TO RELATED APPLICATION

This application claims priority from and the benefit of Korean Patent Application No. 10-2020-0029917 filed on Mar. 11, 2020 which is hereby incorporated by reference for all purposes as if fully set forth herein.

BACKGROUND

The present invention relates to a display device.

Exemplary embodiments and implementations of the invention, electronic products such as smart phones, digital cameras, laptop computers, navigation systems, and smart televisions include a display device for displaying an image to users. The display device generates images and provides users with the images displayed on a display screen.

The display device may include a display panel that generates images and an input sensing part that is on the display panel and detects external inputs. The input sensing part includes a plurality of sensing electrodes that detects external images.

When the display panel is provided with first driving signals that drives the display panel, and when sensing parts are provided with second driving signals that drive the sensing parts, the display device may suffer from noise caused by signal interference between the first driving signals and the second driving signals.

The above information disclosed in this Background section is only for understanding of the background of the inventive concepts, and, therefore, it may contain information that does not constitute prior art.

SUMMARY

Some embodiments of the present invention provide a display device capable of reducing noise caused by signal interference.

Additional features of the inventive concepts will be set forth in the description which follows, and in part will be apparent from the description, or may be learned by practice of the inventive concepts.

According to some example embodiments of the present invention, a display device includes a transistor; a light emitting element disposed on the transistor, the light emitting element including a first electrode, a second electrode on the first electrode, and an emission layer between the first electrode and the second electrode; a data line spaced apart from the light emitting element; and a shield electrode disposed at a level the same as a level of the first electrode. When viewed in a plan, the shield electrode overlaps the data line and extend along the data line.

In some embodiments, when viewed in the plan, a width of the shield electrode may be the same as or greater than a width of the data line.

In some embodiments, when viewed in the plan, the shield electrode may be disposed to a location adjacent to an edge of the data line.

In some embodiments, when viewed in the plan, the shield electrode may be disposed to a location adjacent to the first electrode.

In some embodiments, when viewed in the plan, the shield electrode may be disposed to surround the first electrode.

In some embodiments, the display device may further include a sensing part disposed above the light emitting element. The shield electrode may be disposed between the sensing part and the data line.

In some embodiments, the display device may further include a connection electrode disposed between the transistor and the light emitting element. The connection electrode may connect the transistor to the first electrode.

In some embodiments, the connection electrode may include: a first connection electrode on the transistor and connected to the transistor; and a second connection electrode disposed between the first connection electrode and the first electrode, the second connection electrode connected to the first connection electrode and the first electrode.

In some embodiments, the data line may be disposed at a level the same as a level of the second electrode.

In some embodiments, the display device may further include a first power line that receives a first voltage to be applied to the first electrode; and a second power line that receives a second voltage to be applied to the second electrode. The second voltage may be less than the first voltage.

In some embodiments, the first power line may be disposed at a level the same as a level of the first connection electrode.

In some embodiments, the shield electrode may be connected to the second power line.

In some embodiments, the shield electrode may be connected to the second power line and the second electrode.

In some embodiments, the shield electrode may be connected to the first power line.

In some embodiments, the light emitting element may be provided in plural. The shield electrode may be provided in plural. The plurality of shield electrodes may be disposed to a location adjacent to the first electrodes of the plurality of light emitting elements.

In some embodiments, the display device may further include a first display area that includes a transmission area and a first pixel around the transmission area; and a second display area around the first display area. The second display area may include a second pixel. Each of the first and second pixels may include the transistor and the light emitting element.

In some embodiments, when viewed in the plan, on the first display area, a width of the shield electrode may be greater than a width of the data line. The shield electrode may be disposed to a location adjacent to an edge of the data line.

In some embodiments, when viewed in the plan, on the second display area, the shield electrode may be disposed to a location adjacent to the first electrode.

According to some example embodiments of the present invention, a display device includes a transistor; a light emitting element disposed on the transistor, the light emitting element including a first electrode, a second electrode on the first electrode, and an emission layer between the first electrode and the second electrode; a data line spaced apart from the light emitting element; and a shield electrode that is disposed at a level the same as a level of the first electrode and overlaps the data line in a plan view. The shield electrode extends to an edge of the second electrode and may be connected to the second electrode.

In some embodiments, when viewed in the plan, a width of the shield electrode may be the same as or greater than a width of the data line. The shield electrode may be disposed to surround the first electrode.

According to some example embodiments of the present invention, a display device includes a first display area that includes a transmission area and a first pixel around the transmission area; a second display area around the first display area, the second display area including a second pixel; a plurality of data lines connected to the first and second pixels; and a shield electrode disposed on the data lines. Each of the first and second pixels includes a transistor; and a light emitting element disposed on the transistor, the light emitting element including a first electrode, a second electrode on the first electrode, and an emission layer between the first electrode and the second electrode. The shield electrode may be disposed at a level the same as a level of the first electrode and may overlap the data line in a plan view. When viewed in the plan, a planar area of the shield electrode in the second display area is greater than a planar area of the shield electrode in the first display area.

In some embodiments, on the first display area, the shield electrode may be disposed to a location adjacent to an edge of the data line. On the second display area, the shield electrode may be disposed to a location adjacent to the first electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
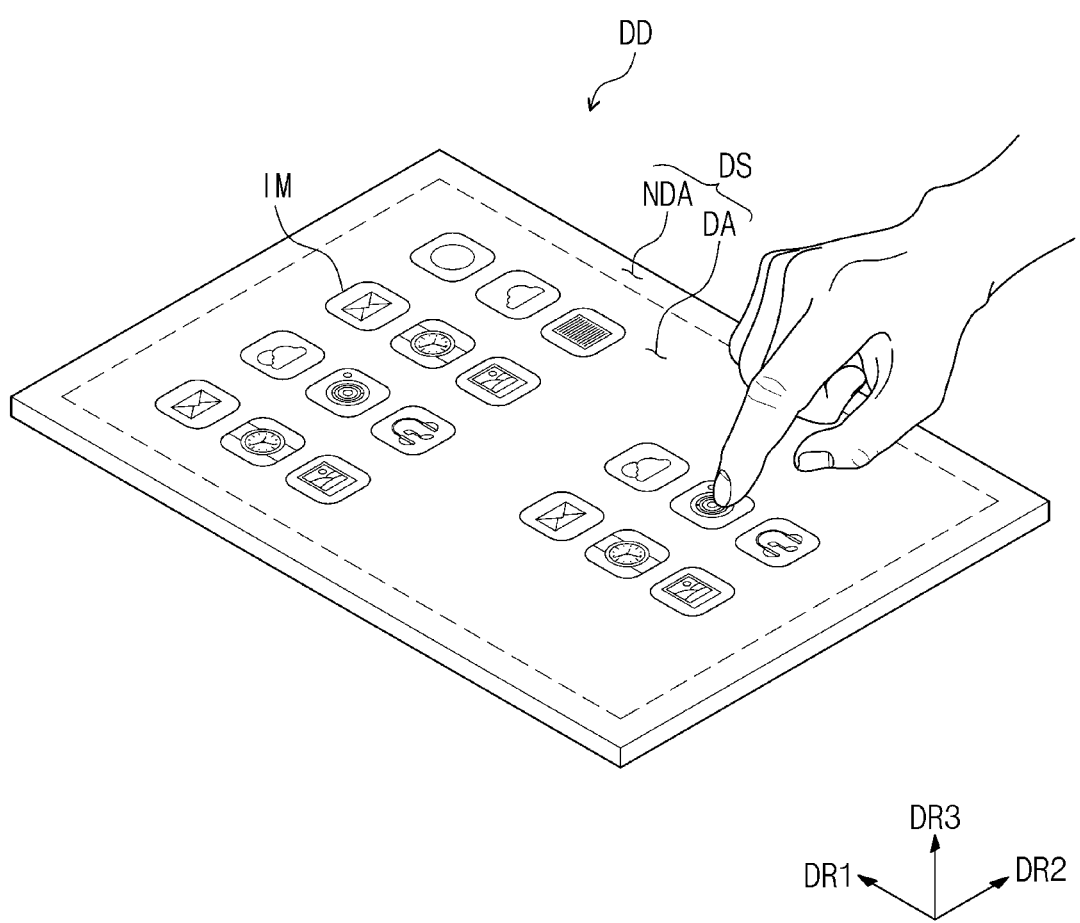
FIG. 1 illustrates a perspective view of a display device according to some embodiments of the present invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Only Use when Application Includes Sectional Drawings

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Choose One of Following when Application Includes Functional Blocks and/or Needs Hardware, Software or Firmware Support Option A:

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Option B:

In exemplary embodiments, XXXXX, and/or one or more components thereof, may be implemented via one or more general purpose and/or special purpose components, such as one or more discrete circuits, digital signal processing chips, integrated circuits, application is specific integrated circuits, microprocessors, processors, programmable arrays, field programmable arrays, instruction set processors, and/or the like.

According to one or more exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, XXXXX, and/or one or more components thereof may include or otherwise be associated with one or more memories (not shown) including code (e.g., instructions) configured to cause XXXXX, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CD-RW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In this description, when a certain component (or region, layer, portion, etc.) is referred to as being "on", "connected to", or "coupled to" other component(s), the certain component may be directly disposed on, directly connected to, or directly coupled to the other component(s) or at least one intervening component may be present therebetween.

Like numerals indicate like components. Moreover, in the drawings, thicknesses, ratios, and dimensions of components are exaggerated for effectively explaining the technical contents.

The term "and/or" includes one or more combinations defined by associated components.

It will be understood that, although the terms first, second, etc. may be used herein to describe various components, these components should not be limited by these terms. These terms are only used to distinguish one component from another component. For example, a first component could be termed a second component, and vice versa without departing from the scope of the present invention. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

The following will now describe in detail some embodiments of the present invention in conjunction with the accompanying drawings.

FIG. 1 illustrates a perspective view of a display device according to some embodiments of the present invention.

Referring to FIG. 1, a display device DD according to some embodiments of the present invention may have a rectangular shape with long sides that extend in a first direction DR1 and short sides that extend in a second direction DR2 intersecting the first direction DR1. The present invention, however, is not limited thereto, and the display device DD may have various shapes such as a circular shape or a polygonal shape.

A third direction DR3 is defined herein as a direction that substantially vertically intersects a plane formed by the first and second directions DR1 and DR2. In this description, the phrase "when viewed in plan" means that "when viewed in the third direction DR3."

The display device DD may have a top surface, and the top surface may be defined as a display surface DS and may have a plane formed by the first and second directions DR1 and DR2. The display surface DS may provide users with images IM generated from the display device DD.

The display surface DS may include a display area DA and a non-display area NDA around the display area DA. The display area DA may display the images IM, and the non-display area NDA may not display the images IM. The non-display area NDA may surround the display area DA and may provide the display device DD with an edge printed with a certain color.

The display device DD may be used for large-sized display apparatuses such as televisions, monitors, or outdoor billboards. In addition, the display device DD may be used for small and medium-sized electronic products, such as personal computers, laptop computers, personal digital terminals, automotive navigation systems, game consoles, smart phones, tablet computers, or cameras. These products are presented as an exemplary embodiment, and the display device DD may be used for any other electronic products without departing from the present inventive concepts.

Figure 2:
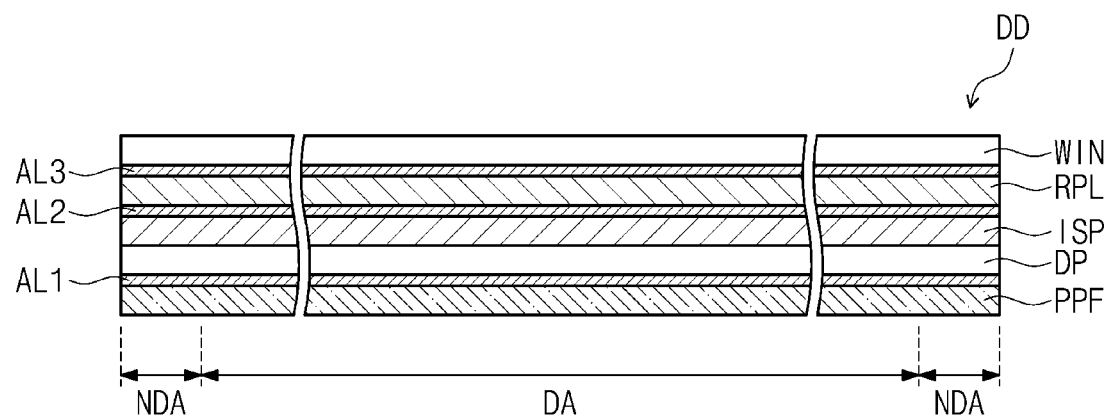
FIG. 2 illustrates a cross-sectional view exemplarily of the display device depicted in FIG. 1.
Figure 2:
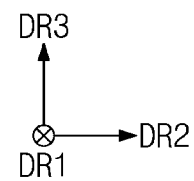

FIG. 2 illustrates a cross-sectional view exemplarily of the display device depicted in FIG. 1.

FIG. 2 exemplarily illustrates a cross-section of the display device DD when viewed in the first direction DR1.

Referring to FIG. 2, the display device DD may include a display panel DP, an input sensing part ISP, an antireflection layer RPL, a window WIN, a panel protection film PPF, and first to third adhesive layers AL1 to AL3. The display panel DP may be a flexible display panel. For example, the display panel DP may include a plurality of electronic elements disposed on a flexible substrate.

The display panel DP according to some embodiments of the present invention may be an emissive display panel, but the present invention is not necessarily limited thereto. For example, the display panel DP may be an organic light emitting display panel or a quantum-dot light emitting display panel. An emission layer of the organic light emitting display panel may include an organic light emitting material. An emission layer of the quantum-dot light emitting display panel may include a quantum-dot or a quantum-rod. The following will describe an example in which an organic light emitting display panel is used as the display panel DP.

The input sensing part ISP may be disposed on the display panel DP. The input sensing part ISP may include a plurality of sensors (not illustrated) that use a capacitance method to detect an external input. The input sensing part ISP may be directly fabricated on the display panel DP during its fabrication. The present invention, however, is not limited thereto, and when the display panel DP is manufactured, the input sensing part ISP may be separately fabricated in the form of a panel and then attached to the display panel DP through an adhesive.

The antireflection layer RPL may be disposed on the input sensing part ISP. The antireflection layer RPL may reduce a reflectance of external light that is incident toward the display panel DP from an outside of the display device DD. For example, the antireflection layer RPL may include one or more of a retarder and a polarizer.

The window WIN may be disposed on the antireflection layer RPL. The window WIN may protect the display panel DP, the input sensing part ISP, and the antireflection layer RPL against external scratches and impact.

The panel protection film PPF may be disposed below the display panel DP. The panel protection film PPF may protect a lower portion of the display panel DP. The panel protection film PPF may include a flexible plastic material, such as polyethyleneterephthalate (PET).

The first adhesive layer AL1 may be disposed between the display panel DP and the panel protection film PPF. The first adhesive layer AL1 may attach the display panel DP and the panel protection film PPF to each other. The second adhesive layer AL2 may be disposed between the antireflection layer RPL and the input sensing part ISP. The second adhesive layer AL2 may attach the antireflection layer RPL and the input sensing part ISP to each other. The third adhesive layer AL3 may be disposed between the window WIN and the antireflection layer RPL. The third adhesive layer AL3 may attach the window WIN and the antireflection layer RPL to each other.

Figure 3:
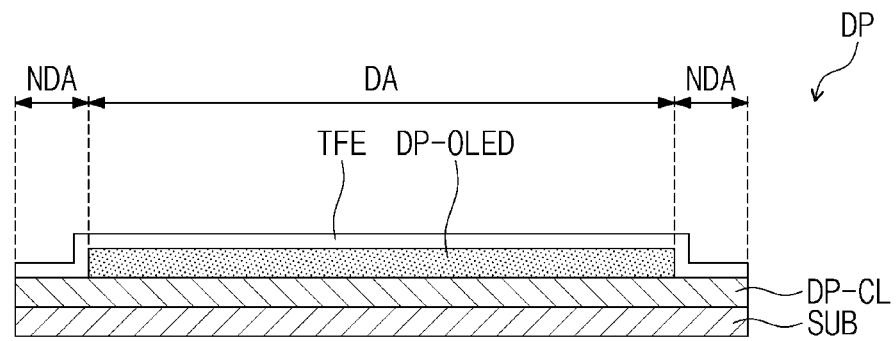
FIG. 3 illustrates a cross-sectional view exemplarily of a display panel depicted in FIG. 2.
Figure 3:
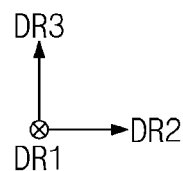

FIG. 3 illustrates a cross-sectional view exemplarily of the display panel depicted in FIG. 2.

FIG. 3 exemplarily illustrates a cross-section of the display panel DP when viewed in the first direction DR1.

Referring to FIG. 3, the display panel DP may include a substrate SUB, a circuit element layer DP-CL disposed on the substrate SUB, a display element layer DP-OLED disposed on the circuit element layer DP-CL, and a thin-film encapsulation layer TFE disposed on the display element layer DP-OLED.

The substrate SUB may include a display area DA and a non-display area NDA around the display area DA. The substrate SUB may include a flexible plastic material, such as polyimide (PI). The display element layer DP-OLED may be disposed on the display area DA.

A plurality of pixels may be disposed on the circuit element layer DP-CL and the display element layer DP-OLED. Each of the pixels may include a transistor disposed on the circuit element layer DP-CL, and may also include a light emitting element that is disposed on the display element layer DP-OLED and is connected to the transistor. A configuration of the pixel will be further discussed in detail below.

The thin-film encapsulation layer TFE may be disposed on the circuit element layer DP-CL to cover the display element layer DP-OLED. The thin-film encapsulation layer TFE may include an inorganic layer, an organic layer, and an inorganic layer that are sequentially stacked. The inorganic layers may include an inorganic material, and may protect the pixels against moisture and/or oxygen. The organic layer may include an organic material, and may protect the pixels against foreign substances such as dust particles.

Figure 4:
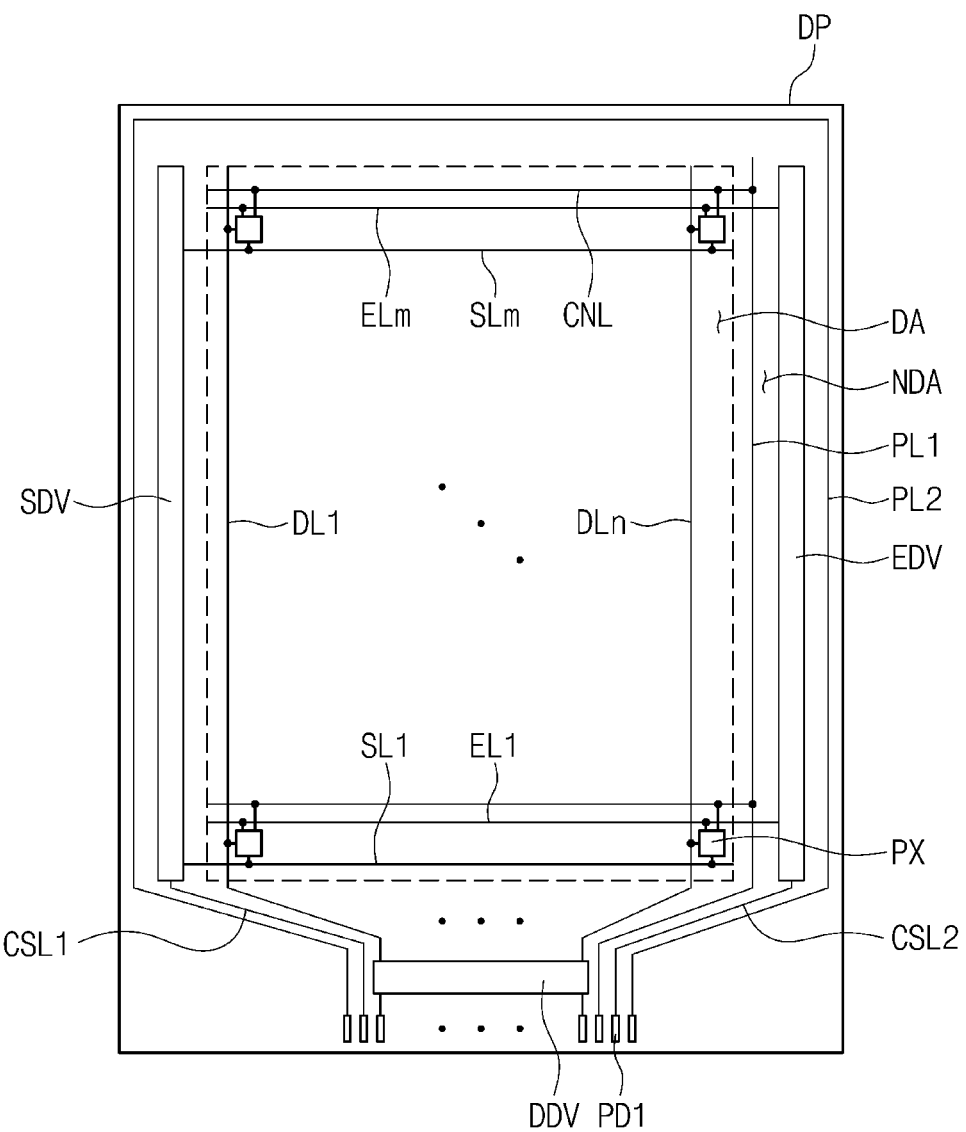
FIG. 4 illustrates a plan view of the display panel depicted in FIG. 3.
Figure 4:
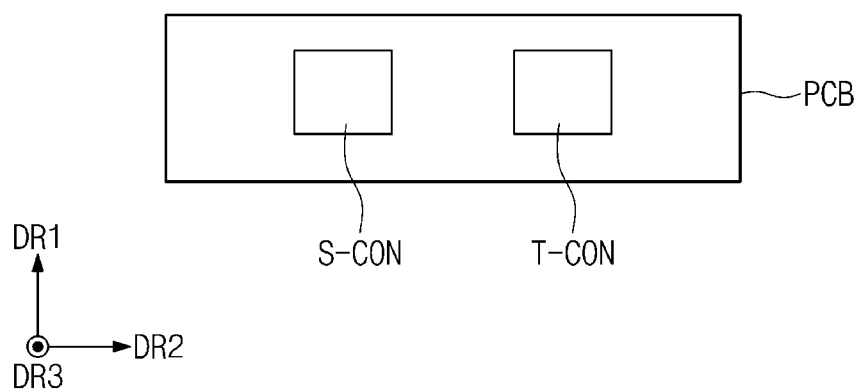

FIG. 4 illustrates a plan view of the display panel depicted in FIG. 3.

Referring to FIG. 4, the display device DD may include a display panel DP, a scan driver SDV, a data driver DDV, an emission driver EDV, a printed circuit board PCB, a timing controller T-CON, and a sensing controller S-CON. The display panel DP may have a rectangular shape with long sides that extend in the first direction DR1 and short sides that extend in the second direction DR2. The display panel DP may include a display area DA and a non-display area NDA that surrounds the display area DA.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, first and second power lines PL1 and PL2, connection lines CNL, and a plurality of first pads PD1. The subscripts "m" and "n" are natural numbers.

The pixels PX may be disposed on the display area DA. The scan driver SDV and the emission driver EDV may be disposed on the non-display area NDA and adjacent to corresponding long sides of the display panel DP. The data driver DDV may be disposed on the non-display area NDA adjacent to one of the short sides of the display panel DP. When viewed in plan, the data driver DDV may be adjacent to a bottom end of the display panel DP. The data driver DDV may be fabricated in the form of an integrated circuit chip and may be mounted on the display panel DP.

The scan lines SL1 to SLm may extend in the second direction DR2 to have connection with the pixels PX and the scan driver SDV. The data lines DL1 to DLn may extend in the first direction DR1 to have connection with the pixels PX and the data driver DDV. The emission lines EL1 to ELm may extend in the second direction DR2 to have connection with the pixels PX and the emission driver EDV.

The first power line PL1 may extend in the first direction DR1 to be disposed on the non-display area NDA. The first power line PL1 may be disposed between the display area DA and the emission driver EDV or between the display area DA and the scan driver SDV, but the present invention is not necessarily limited thereto.

The connection lines CNL may extend in the second direction DR2 and may be arranged in the first direction DR1. The connection lines CNL may be connected to the first power line PL1 and the pixels PX. The pixels PX may be supplied with a first voltage though the first power line PL1 and the connection lines CNL coupled to the first power line PL1.

The connection lines CNL may be unitarily formed with the first power line PL1 and may extend from the first power line PL1. The present invention, however, is not limited thereto, and the connection lines CNL may be located at a different level from that of the first power line PL1 and may be connected to the first power line PL1 through connection electrodes separately provided. The connection line CNL may be called the first power line PL1.

The second power line PL2 may be disposed on the non-display area NDA. The second power line PL2 may extend along the long sides of the display panel DP and along the short side around which the data driver DDV is not disposed. The second power line PL2 may be disposed outside the scan driver SDV and the emission driver EDV. Although not illustrated, the second power line PL2 may extend toward the display area DA to have connection with the pixels PX. The second power line PL2 may supply the pixels PX with a second voltage less than the first voltage.

The first control line CSL1 may be connected to the scan driver SDV, and when viewed in plan, may extend toward the bottom end of the display panel DP. The second control line CSL2 may be connected to the emission driver EDV, and when viewed in plan, may extend toward the bottom end of the display panel DP. The data driver DDV may be disposed between the first control line CSL1 and the second control line CSL2.

The display panel DP may be provided with the first pads PD1 on a location adjacent to the bottom end thereof. The first pads PD1 may be connected to the data driver DDV, the first power line PL1, the second power line PL2, the first control line CSL1, and the second control line CSL2. The data lines DL1 to DLn may be connected to the data driver DDV, and the data driver DDV may be connected to the first pads PD1 that correspond to the data lines DL1 to DLn.

The printed circuit board PCB may be connected to the first pads PD1. The timing controller T-CON and the sensing controller S-CON may each be fabricated in the form of an integrated circuit chip and may be mounted on the printed circuit board PCB. The timing controller T-CON may be connected through the printed circuit board PCB to the first pads PD1 that are coupled to the data driver DDV and the first and second control lines CSL1 and CSL2. Although not illustrated, the printed circuit board PCB may be provided thereon with a voltage generator which produces the first and second voltages and which is connected to the first pads PD1 coupled to the first and second power lines PL1 and PL2.

The timing controller T-CON may generate a scan control signal, a data control signal, and an emission control signal. The scan control signal may be provided through the first control line CSL1 to the scan driver SDV. The emission control signal may be provided through the second control line CSL2 to the emission driver EDV. The data control signal may be provided to the data driver DDV. The timing controller T-CON may provide the data driver DDV with image signals.

In response to the scan control signal, the scan driver SDV may generate a plurality of scan signals, and the scan signals may be applied through the scan lines SL1 to SLm to the pixels PX. In response to the data control signal, the data driver DDV may generate a plurality of data voltages that correspond to the image signals. The data voltages may be provided through the data lines DL1 to DLn to the pixels PX. In response to the emission control signal, the emission driver EDV may generate a plurality of emission signals, and the emission signals may be applied through the emission lines EL1 to ELn to the pixels PX.

In response to the scan signals, the pixels PX may be provided with the data voltages. In response to the emission signals, the pixels PX may emit light whose brightness corresponds to the data voltages, thereby displaying an image. The emission signals may control light emission timing of the pixels PX.

The sensing controller S-CON may be connected through the printed circuit board PCB to second and third pads of the input sensing part ISP, which second and third pads will be discussed below. The sensing controller S-CON may provide the input sensing part ISP with signals configured to drive the input sensing part ISP.

Figure 5:
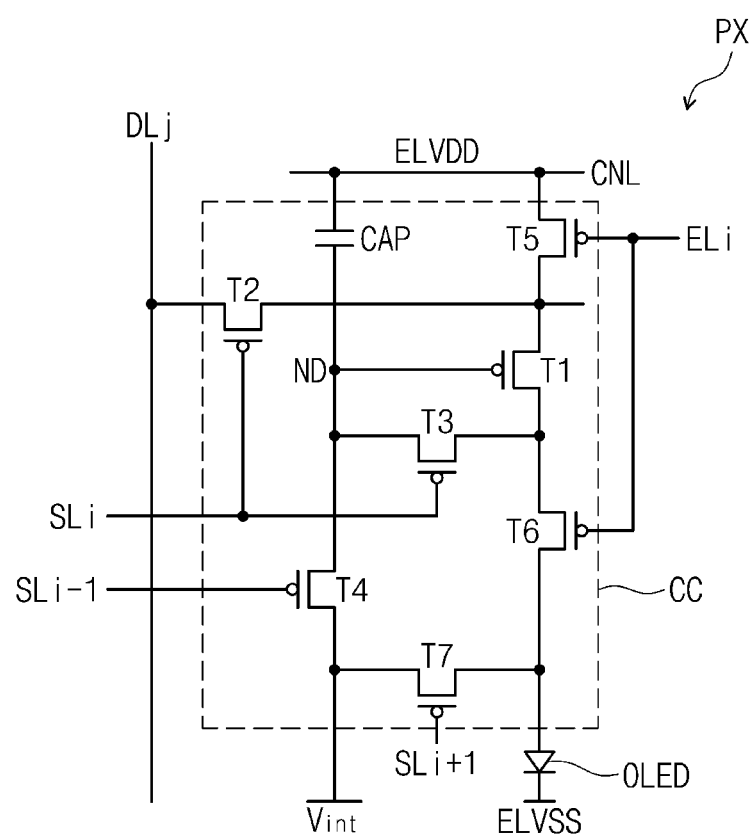
FIG. 5 illustrates an equivalent circuit diagram exemplarily of one pixel depicted in FIG. 4.

FIG. 5 illustrates an equivalent circuit diagram exemplarily of one pixel depicted in FIG. 4.

Referring to FIG. 5, the pixel PX may include a light emitting element OLED and a pixel circuit CC. The pixel circuit CC may include a plurality of transistors T1 to T7 and a capacitor CAP. Each of the transistors T1 to T7 (referred to hereinafter as first to seventh transistors) may include an input electrode (or source electrode), an output electrode (or drain electrode), and a control electrode (or gate electrode). In this description, one of the input and output electrodes may be called a first electrode, and the other of the input and output electrodes may be called a second electrode.

The first electrode of the first transistor T1 may be supplied through the fifth transistor T5 with a first voltage ELVDD, and the second electrode of the first transistor T1 may be coupled through the sixth transistor T6 to an anode electrode of the light emitting element OLED. A cathode electrode of the light emitting element OLED may be supplied with a second voltage ELVSS less than the first voltage ELVDD.

The first transistor T1 may be defined as a driver transistor. In accordance with a voltage applied to the control electrode of the first transistor T1, the first transistor T1 may control an amount of current that flows through the light emitting element OLED.

The second transistor T2 may be coupled between a data line DLj and the first electrode of the first transistor T1, and the control electrode of the second transistor T2 may be coupled to an ith scan line SLi. The subscripts "i" and "j" are natural numbers. When the second transistor T2 is provided with an ith scan signal from the ith scan line SLi, the second transistor T2 may be turned on to electrically couple the data line DLj to the first electrode of the first transistor T1.

The third transistor T3 may be coupled between the second and control electrodes of the first transistor T1. The control electrode of the third transistor T3 may be coupled to the ith scan line SLi. When the third transistor T3 is provided with the ith scan signal from the ith scan line SLi, the third transistor T3 may be turned on to electrically couple the second and control electrodes of the first transistor T1 to each other. When the third transistor T3 is turned on, the first transistor T1 may be coupled in a diode type.

The fourth transistor T4 may be coupled between a node ND and an initialization power generator (not illustrated). The control electrode of the fourth transistor T4 may be coupled to an (i−1)th scan line SLi−1. When the fourth transistor T4 is provided with an (i−1)th scan signal from the (i−1)th scan line SLi−1, the fourth transistor T4 may be turned on to provide the node ND with an initialization voltage Vint.

The fifth transistor T5 may be coupled between the connection line CNL and the first electrode of the first transistor T1. The first power line PL1 may be connected to the light emitting element OLED through the connection line CNL, the fifth transistor T5, the first transistor T1, and the sixth transistor T6. The control electrode of the fifth transistor T5 may be coupled to an ith emission line ELi.

The sixth transistor T6 may be coupled between the second electrode of the first transistor T1 and the anode electrode of the light emitting element OLED. The control electrode of the sixth transistor T6 may be coupled to the ith emission line ELi.

The seventh transistor T7 may be coupled between the initialization power generator (not illustrated) and the anode electrode of the light emitting element OLED. The control electrode of the seventh transistor T7 may be coupled to an (i+1)th scan line SLi+1. When the seventh transistor T7 is provided with an (i+1)th scan signal from the (i+1)th scan line SLi+1, the seventh transistor T7 may be turned on to provide the initialization voltage Vint to the anode electrode of the light emitting element OLED.

The capacitor CAP may be disposed between the connection line CNL and the node ND. The capacitor CAP may store a data voltage. When the fifth and sixth transistors T5 and T6 are turned on, an amount of current flowing through the first transistor T1 may be determined, depending on a voltage stored in the capacitor CAP. The light emitting element OLED may be provided with a current through the sixth transistor T6, thereby generating light.

Figure 6:
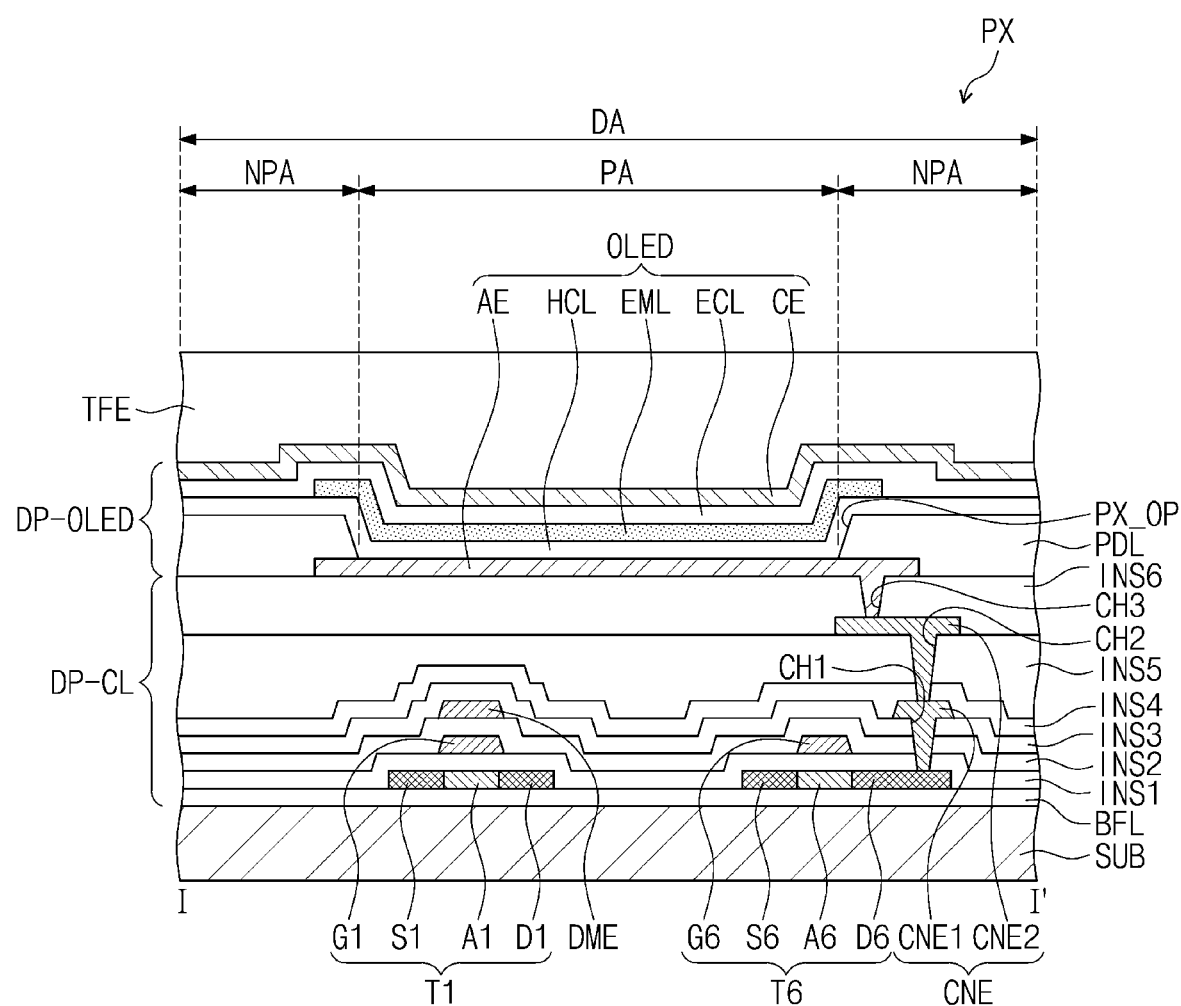
FIG. 6 illustrates a cross-sectional view exemplarily of a region corresponding to a light emitting element depicted in FIG. 5.

FIG. 6 illustrates a cross-sectional view exemplarily of a region corresponding to the light emitting element depicted in FIG. 5.

FIG. 6 exemplarily illustrates cross-sections of the first and sixth transistors T1 and T6.

Referring to FIG. 6, the light emitting element OLED may include a first electrode AE, a second electrode CE, a hole control layer HCL, an electron control layer ECL, and an emission layer EML. The first electrode AE may be an anode electrode, and the second electrode CE may be a cathode electrode.

The first and sixth transistors T1 and T6 and the light emitting element OLED may be disposed on the substrate SUB. The display area DA may include an emission area PA that corresponds to a corresponding one of the pixels PX and a non-emission area NPA around the emission area PA. The light emitting element OLED may be disposed on the emission area PA.

A buffer layer BFL may be disposed on the substrate SUB, and the buffer layer BFL may be an inorganic layer. A semiconductor pattern may be disposed on the buffer layer BFL. The semiconductor pattern may include polysilicon. The present invention, however, is not limited thereto, and the semiconductor pattern may include amorphous silicon or metal oxide. The semiconductor pattern may be specifically arranged on the emission areas PA of the pixels PX.

The semiconductor pattern may have electrical characteristics that are changed depending on whether the semiconductor pattern is doped or not. The semiconductor pattern may include a doped region and an undoped region. The doped region may be implanted with n-type or p-type impurities. The doped region may have conductivity greater than that of the undoped region, and may substantially serve as an electrode, such as a source or drain of a transistor. The undoped region may substantially correspond to an active (or channel) of a transistor.

The first transistor T1 may have a source S1, an active A1, and a drain D1 that are formed from the semiconductor pattern, and the sixth transistor T6 may have a source S6, an active A6, and a drain D6 that are formed from the semiconductor pattern. A first dielectric layer INS1 may be disposed on the semiconductor pattern. Gates G1 and G6 of the first and sixth transistors T1 and T6 may be disposed on the first dielectric layer INS1. A second dielectric layer INS2 may be disposed on the gates G1 and G6. A dummy electrode DME may be disposed on the second dielectric layer INS2. A third dielectric layer INS3 may be disposed on the dummy electrode DME.

A connection electrode CNE may be disposed between the sixth transistor T6 and the light emitting element OLED. The connection electrode CNE may connect the sixth transistor T6 and the light emitting element OLED to each other. The connection electrode CNE may include a first connection electrode CNE1 and a second connection electrode CNE2 on the first connection electrode CNE1. The second connection electrode CNE2 may be disposed between the first connection electrode CNE1 and the first electrode AE. The first connection electrode CNE1 may be connected to the sixth transistor T6, and the second connection electrode CNE2 may be connected to the first electrode AE.

The first connection electrode CNE1 may be disposed on the third dielectric layer INS3, and may be connected to the drain D6 through a first contact hole CH1 defined in the first to third dielectric layers INS1 to INS3. A fourth dielectric layer INS4 may be disposed on the first connection electrode CNE1. A fifth dielectric layer INS5 may be provided on the fourth dielectric layer INS4. The second connection electrode CNE2 may be disposed on the fifth dielectric layer INS5. The second connection electrode CNE2 may be connected to the first connection electrode CNE1 through a second contact hole CH2 defined in the fifth dielectric layer INS5.

A sixth dielectric layer INS6 may be disposed on the second connection electrode CNE2. The circuit element layer DP-CL may be defined to include components from the buffer layer BFL to the fifth dielectric layer INS5. The first to sixth dielectric layers INS1 to INS6 may be inorganic layers or organic layers.

The first electrode AE may be disposed on the sixth dielectric layer INS6. The first electrode AE may be connected to the second connection electrode CNE2 through a third contact hole CH3 defined in the sixth dielectric layer INS6. A pixel definition layer PDL may be disposed on the first electrode AE and the sixth dielectric layer INS6, and the pixel definition layer PDL may expose a portion of the first electrode AE. The pixel definition layer PDL may have an opening PX_OP that exposes the portion of the first electrode AE.

The hole control layer HCL may be disposed on the first electrode AE and the pixel definition layer PDL. The hole control layer HCL may be disposed in common on the emission area PA and the non-emission area NPA. The hole control layer HCL may include a hole transport layer and a hole injection layer.

The emission layer EML may be disposed on the hole control layer HCL. The emission layer EML may be disposed on a region that corresponds to the opening PX_OP. The emission layer EML may include one or more of an organic light-emitting material and an inorganic light-emitting material. The emission layer EML may generate one of a red light, a green light, and a blue light.

The electron control layer ECL may be disposed on the emission layer EML and the hole control layer HCL. The electron control layer ECL may be disposed in common on the emission area PA and the non-emission area NPA. The electron control layer ECL may include an electron transport layer and an electron injection layer.

The second electrode CE may be disposed on the electron control layer ECL. The second electrode CE may be disposed in common on the pixels PX. The thin-film encapsulation layer TFE may be disposed on the light emitting element OLED. A section where the light emitting element OLED is disposed may be defined as the display element layer DP-OLED.

The first voltage ELVDD may be applied to the first electrode AE, and the second voltage ELVSS may be applied to the second electrode CE. Holes and electrons injected into the emission layer EML may combine with each other to produce excitons, and the light emitting element OLED may emit light as the excitons return to ground state. The light emitting element OLED may emit light to display an image.

Figure 7:
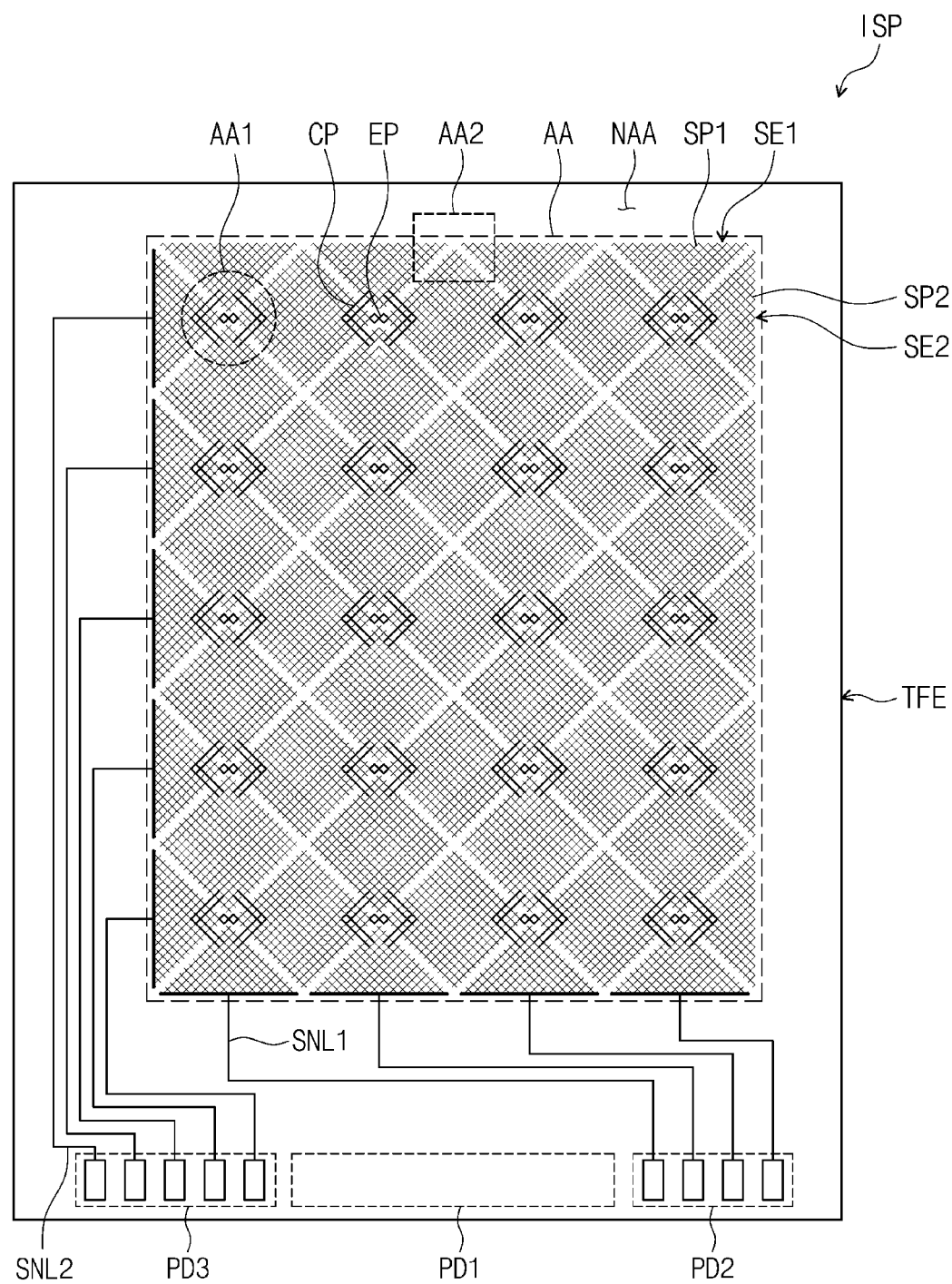
FIG. 7 illustrates a plan view of an input sensing part depicted in FIG. 2.

FIG. 7 illustrates a plan view of the input sensing part depicted in FIG. 2.

Referring to FIG. 7, the input sensing part ISP may include a plurality of sensing electrodes SE1 and SE2, a plurality of wiring lines SNL1 and SNL2, and a plurality of second and third pads PD2 and PD3. The sensing electrodes SE1 and SE2, the wiring lines SNL1 and SNL2, and the second and third pads PD2 and PD3 may be disposed on the thin-film encapsulation layer TFE.

The input sensing part ISP may have a planar region including an active area AA and an inactive area NAA around the active area AA. The active area AA may overlap the display area DA, and the inactive area NAA may overlap the non-display area NDA. The sensing electrodes SE1 and SE2 may be disposed on the active area AA, and the second and third pads PD2 and PD3 may be disposed on the inactive area NAA.

The wiring lines SNL1 and SNL2 may be connected to ends of the sensing electrodes SE1 and SE2, and may extend toward the inactive area NAA to have connection with the second and third pads PD2 and PD3. The second and third pads PD2 and PD3 may be connected to the printed circuit board PCB discussed above. The sensing controller S-CON discussed above may be connected through the printed circuit board PCB to the second and third pads PD2 and PD3.

The sensing electrodes SE1 and SE2 may include a plurality of first sensing electrodes SE1 that extend in the first direction DR1 and are arranged in the second direction DR2, and may also include a plurality of second sensing electrodes SE2 that extend in the second direction DR2 and are arranged in the first direction DR1. The second sensing electrodes SE2 may extend to intersect the first sensing electrodes SE1 and may be insulated from the first sensing electrodes SE1.

The wiring lines SNL1 and SNL2 may include a plurality of first signal lines SNL1 connected to the first sensing electrodes SE1 and a plurality of second signal lines SNL2 connected to the second sensing electrodes SE2. The first signal lines SNL1 may be connected to the second pads PD2. The second signal lines SNL2 may be connected to the third pads PD3.

The first sensing electrodes SE1 may be defined as output sensing electrodes, and the second sensing electrodes SE2 may be defined as input sensing electrodes. The input sensing part ISP may be driven in a mutual detection mode. For example, driving signals may be input through the second signal lines SNL2 to the second sensing electrodes SE2, and sensing signals may be output through the first signal lines SNL1 from the first sensing electrodes SE1.

Each of the first sensing electrodes SE1 may include a plurality of first sensing parts SP1 that are arranged in the first direction DR1 and a plurality of connection patterns CP that connect the first sensing parts SP1 to each other. Each of the connection patterns CP may be disposed between two first sensing parts SP1 adjacent to each other in the first direction DR1, and may connect the two first sensing parts SP1 to each other.

Each of the second sensing electrodes SE2 may include a plurality of second sensing parts SP2 that are arranged in the second direction DR2 and a plurality of extension patterns EP that extend from the second sensing parts SP2. Each of the extension patterns EP may be disposed between two second sensing parts SP2 adjacent to each other in the second direction DR2, and may extend from the two second sensing parts SP2.

The first and second sensing parts SP1 and SP2 may each have a mesh shape. The first sensing parts SP1 may be disposed spaced apart from and alternately with the second sensing parts SP2, with no overlap between the first sensing parts SP1 and the second sensing parts SP2. The first and second sensing parts SP1 and SP2 may produce capacitance. The extension pattern EP may not overlap the connection pattern CP.

The first and second sensing parts SP1 and SP2 and the extension patterns EP may be located at the same level. The connection patterns CP may be located at a different level from that of the first and second sensing parts SP1 and SP2 and the extension patterns EP.

Figure 8:
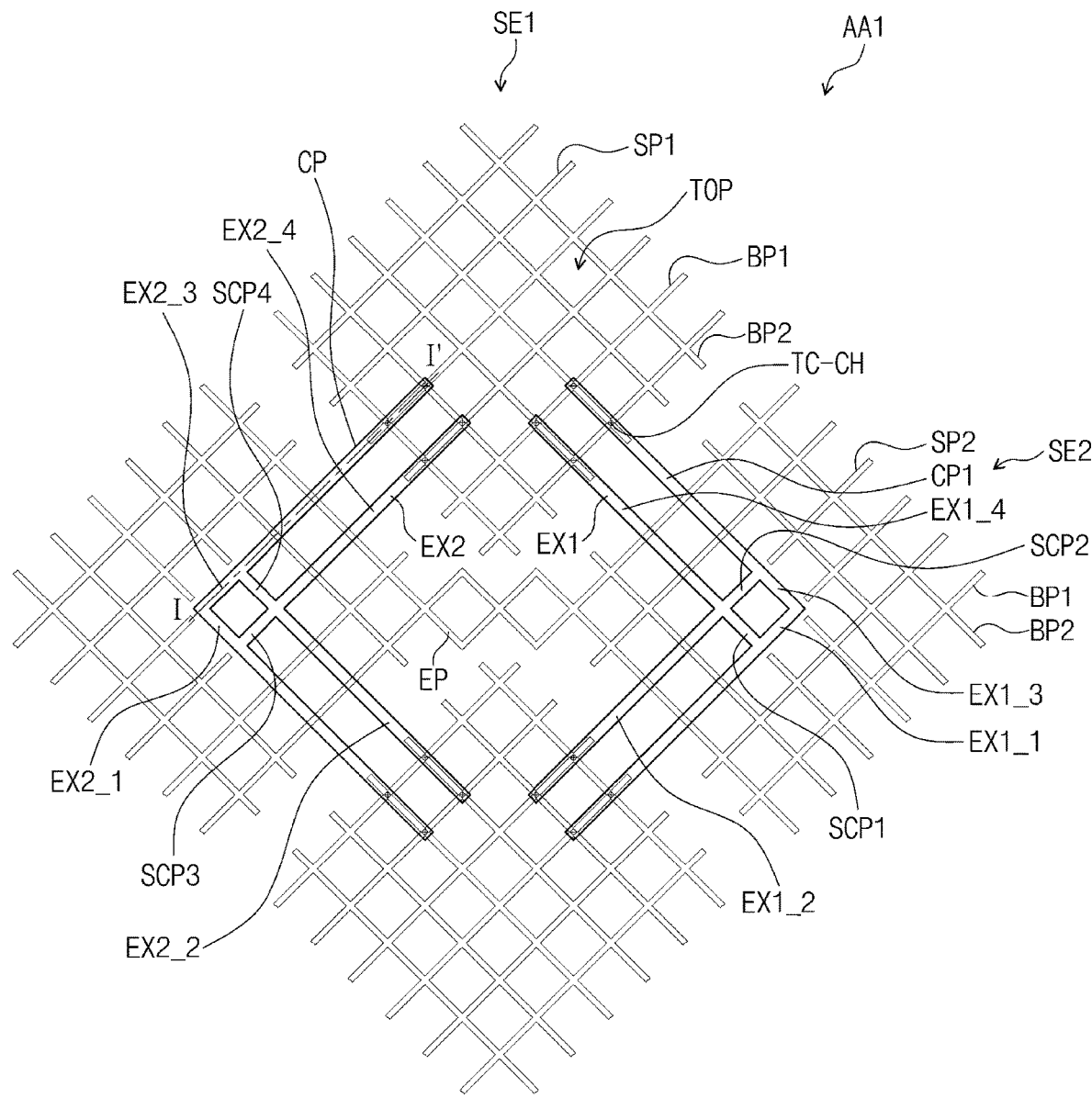
FIG. 8 illustrates an enlarged view of a first area depicted in FIG. 7.
Figure 8:
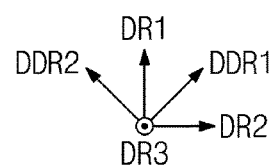

FIG. 8 illustrates an enlarged view of a first area AA1 depicted in FIG. 7.

Referring to FIG. 8, each of the first and second sensing parts SP1 and SP2 may include a plurality of first branches BP1 that extend in a first diagonal direction DDR1 and a plurality of second branches BP2 that extend in a second diagonal direction DDR2, thereby having a mesh shape.

The first diagonal direction DDR1 may be defined to indicate a direction that intersects the first and second directions DR1 and DR2 on a plane formed by the first and second directions DR1 and DR2. The second diagonal direction DDR2 may be defined to indicate a direction that intersects the first diagonal direction DDR1 on a plane formed by the first and second directions DR1 and DR2. For example, the first and second directions DR1 and DR2 may vertically intersect each other, and the first and second diagonal directions DDR1 and DDR2 may vertically intersect each other.

The first branches BP1 of each of the first and second sensing parts SP1 and SP2 may intersect the second branches BP2 of the each of the first and second sensing parts SP1 and SP2, and the first and second branches BP1 and BP2 of each of the first and second sensing parts SP1 and SP2 may be unitarily formed with each other. The first branches BP1 and the second branches BP2 may define touch openings TOP each having a rhombic shape.

The connection pattern CP may extend without overlapping the extension pattern EP, and may connect the first sensing parts SP1 to each other. The connection pattern CP may be connected to the first sensing parts SP1 through a plurality of contact holes TC-CH. The connection pattern CP may extend toward the first sensing parts SP1 after passing through regions that overlap the second sensing parts SP2. The connection pattern CP may be defined as a first conductive pattern.

The extension pattern EP may be disposed between the first sensing parts SP1 and may extend from the second sensing parts SP2. The second sensing parts SP2 and the extension pattern EP may be unitarily formed with each other. The extension pattern EP may have a mesh shape. The extension pattern EP, the first sensing parts SP1, and the second sensing parts SP2 may be formed of the same material and may be formed by being patterned at the same time. The extension pattern EP, the first sensing parts SP1, and the second sensing parts SP2 may be located at the same level and may be defined as a second conductive pattern.

The connection pattern CP may include a first extension EX1 and a second extension EX2 whose shape is symmetrical to that of the first extension EX1. The extension pattern EP may be disposed between the first extension EX1 and the second extension EX2. The first extension EX1 may extend through a region that overlaps one of the second sensing parts SP2, and may be connected to the first sensing parts SP1. The second extension EX2 may extend through a region that overlaps another of the second sensing parts SP2, and may be connected to the first sensing parts SP1.

Based on its relative position, the first sensing part SP1 is defined hereinafter as an upper-side first sensing part SP1 or a lower-side first sensing part SP1. In addition, based on its relative position, the second sensing part SP2 is defined hereinafter as a left-side second sensing part SP2 or a right-side second sensing part SP2.

The first and second extensions EX1 and EX2 may have portions adjacent to sides thereof, and the portions may be connected through a plurality of contact holes TC-CH to the lower-side first sensing part SP1. The first and second extensions EX1 and EX2 may have portions adjacent to other sides thereof, and the portions may be connected through a plurality of contact holes TC-CH to the upper-side first sensing part SP1. A structure of the contact hole TC-CH will be illustrated in FIG. 9 below.

The first extension EX1 may include a first sub-extension EX1_1 and a second sub-extension EX1_2 that extend in the first diagonal direction DDR1, a third sub-extension EX1_3 and a fourth sub-extension EX1_4 that extend in the second diagonal direction DDR2, a first sub-conductive pattern SCP1 that extends in the second diagonal direction DDR2, and a second sub-conductive pattern SCP2 that extends in the first diagonal direction DDR1.

The first and second sub-extensions EX1_1 and EX1_2 may have portions adjacent to sides thereof, and the portions may be connected through a plurality of contact holes TC-CH to the lower-side first sensing part SP1. The third and fourth sub-extensions EX1_3 and EX1_4 may have portions adjacent to sides thereof, and the portions may be connected through a plurality of contact holes TC-CH to the upper-side first sensing part SP1.

The first sub-extension EX1_1 may have other side that extends from other side of the third sub-extension EX1_3, and the second sub-extension EX1_2 may have other side that extends from other side of the fourth sub-extension EX1_4. The first sub-conductive pattern SCP1 may extend in the second diagonal direction DDR2 from the other side of the fourth sub-extension EX1_4 toward the first sub-extension EX1_1. The second sub-conductive pattern SCP2 may extend in the first diagonal direction DDR1 from the other side of the second sub-extension EX1_2 toward the third sub-extension EX1_3.

The first to fourth sub-extensions EX1_1 to EX1_4 and the first and second sub-conductive patterns SCP1 and SCP2 may be unitarily formed with each other.

The first and second sub-extensions EX1_1 and EX1_2 may extend to intersect ones of the second branches BP2 of the right-side second sensing part SP2, which ones of the second branches BP2 are adjacent to the lower-side first sensing part SP1. None of the first branches BP1 of the right-side second sensing part SP2 may be disposed on a region that overlaps the first and second sub-extensions EX1_1 and EX1_2 and the second sub-conductive pattern SCP2.

The third and fourth sub-extensions EX1_3 and EX1_4 may extend to intersect ones of the first branches BP1 of the right-side second sensing part SP2, which ones of the first branches BP1 are adjacent to the upper-side first sensing part SP1. None of the second branches BP2 of the right-side second sensing part SP2 may be disposed on a region that overlaps the third and fourth sub-extensions EX1_3 and EX1_4 and the first sub-conductive pattern SCP1.

The second extension EX2 may include a fifth sub-extension EX2_1 and a sixth sub-extension EX2_2 that extend in the second diagonal direction DDR2, a seventh sub-extension EX2_3 and an eighth sub-extension EX2_4 that extend in the first diagonal direction DDR1, a third sub-conductive pattern SCP3 that extends in the first diagonal direction DDR1, and a fourth sub-conductive pattern SCP4 that extends in the second diagonal direction DDR2.

The left-side second sensing part SP2 may have a structure that is symmetrical to that of the right-side second sensing part SP2, and the second extension EX2 may have a structure that is symmetrical to that of the first extension EX1. Therefore, there will hereinafter be omitted description of the fifth to eighth sub-extensions EX2_1 to EX2_4 and the third and fourth sub-conductive patterns SCP3 and SCP4.

Figure 9:
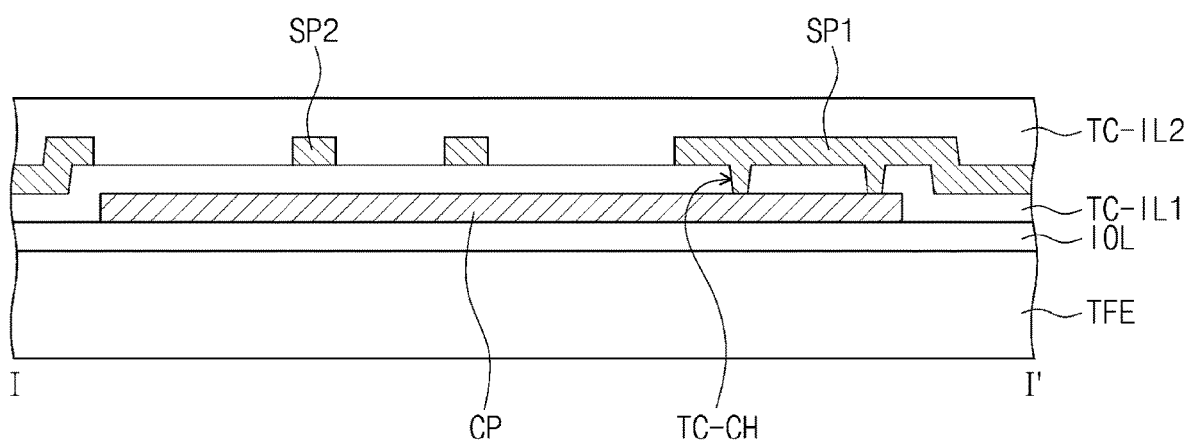
FIG. 9 illustrates a cross-sectional view taken along line I-I' of FIG. 8.

FIG. 9 illustrates a cross-sectional view taken along line I-I' of FIG. 8.

Referring to FIG. 9, a dielectric layer IOL may be disposed on the thin-film encapsulation layer TFE. The dielectric layer IOL may be an inorganic layer. The connection pattern CP may be disposed on the dielectric layer IOL. A first dielectric layer TC-IL1 may be disposed on the connection pattern CP and the dielectric layer IOL. The first dielectric layer TC-IL1 may be an inorganic layer or an organic layer. The first sensing parts SP1 and the second sensing parts SP2 may be disposed on the first dielectric layer TC-IL1. The extension pattern EP unitarily formed with the second sensing parts SP2 may also be disposed on the first dielectric layer TC-IL1.

The connection pattern CP may be connected to the first sensing parts SP1 through a plurality of contact holes TC-CH defined in the first dielectric layer TC-IL1. The first dielectric layer TC-IL1 may be provided thereon with a second dielectric layer TC-IL2 that covers the first sensing parts SP1 and the second sensing parts SP2. The second dielectric layer TC-IL2 may be an organic layer.

Figure 10:
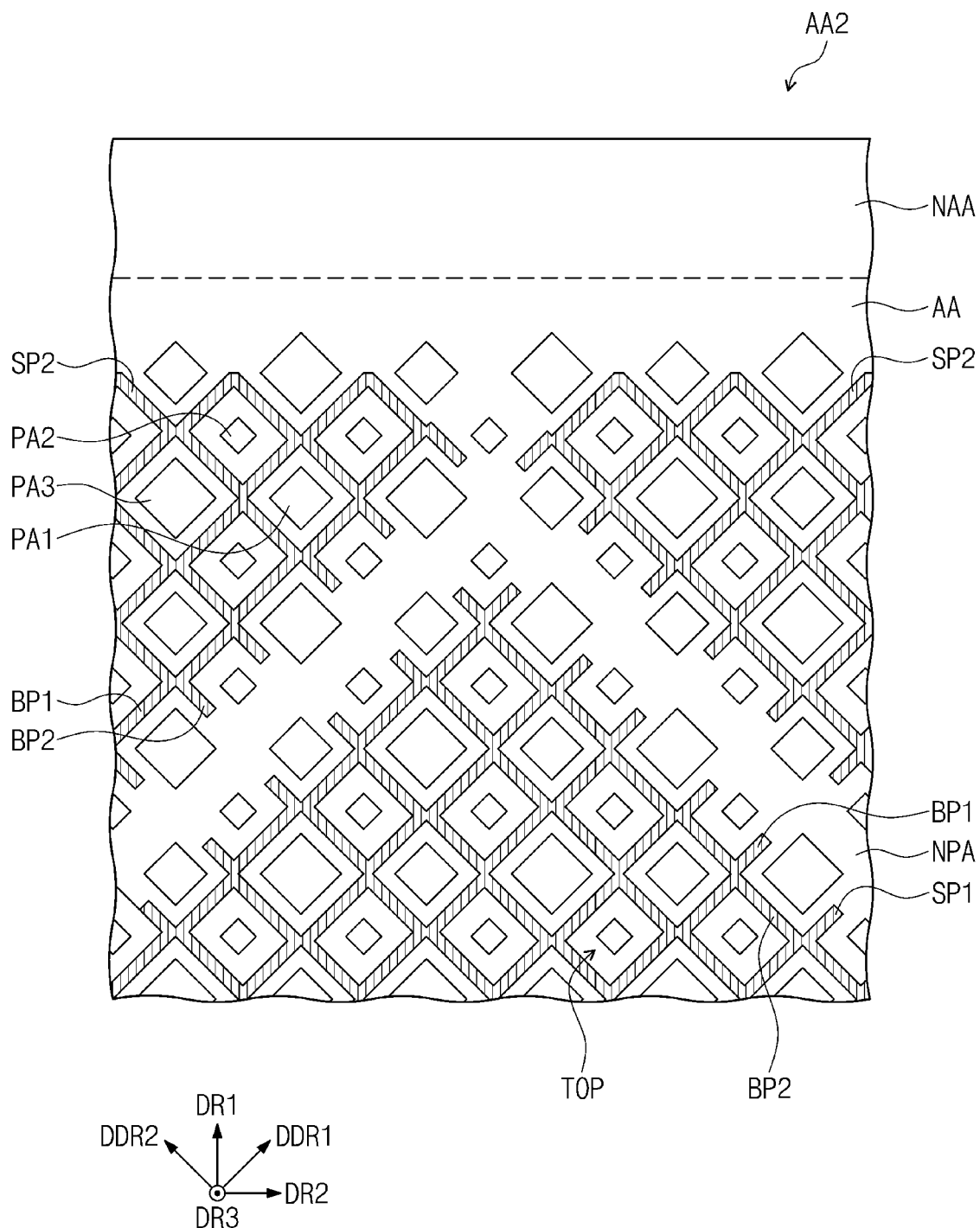
FIG. 10 illustrates an enlarged view of a second area depicted in FIG. 7.

FIG. 10 illustrates an enlarged view of a second area AA2 depicted in FIG. 7.

FIG. 10 exemplarily illustrates emission areas PA1, PA2, and PA3 together with the first and second sensing parts SP1 and SP2.

Referring to FIG. 10, the emission area PA illustrated in FIG. 6 may be one of the emission areas PA1, PA2, and PA3. The emission areas PA1, PA2, and PA3 may be arranged in the first and second diagonal directions DDR1 and DDR2. The first and second branches BP1 and BP2 may overlap the non-emission area NPA between the emission areas PA1, PA2, and PA3.

The emission areas PA1, PA2, and PA3 may include a plurality of first emission areas PA1 each of which displays a red color, a plurality of second emission areas PA2 each of which displays a green color, and a plurality of third emission areas PA3 each of which displays a blue color. The third emission area PA3 may be larger than the first emission area PA1, and the first emission area PA1 may be larger than the second emission area PA2.

The emission areas PA1, PA2, and PA3 may each have a rhombic shape. The touch openings TOP may overlap the emission areas PA1, PA2, and PA3. The touch openings TOP may have their rhombic shapes and sizes that correspond to those of the emission areas PA1, PA2, and PA3.

As the first and second sensing parts SP1 and SP2 are disposed on the non-emission area NPA, light generated from the emission areas PA1, PA2, and PA3 may be normally emitted without being affected by the first and second sensing parts SP1 and SP2.

Figure 11:
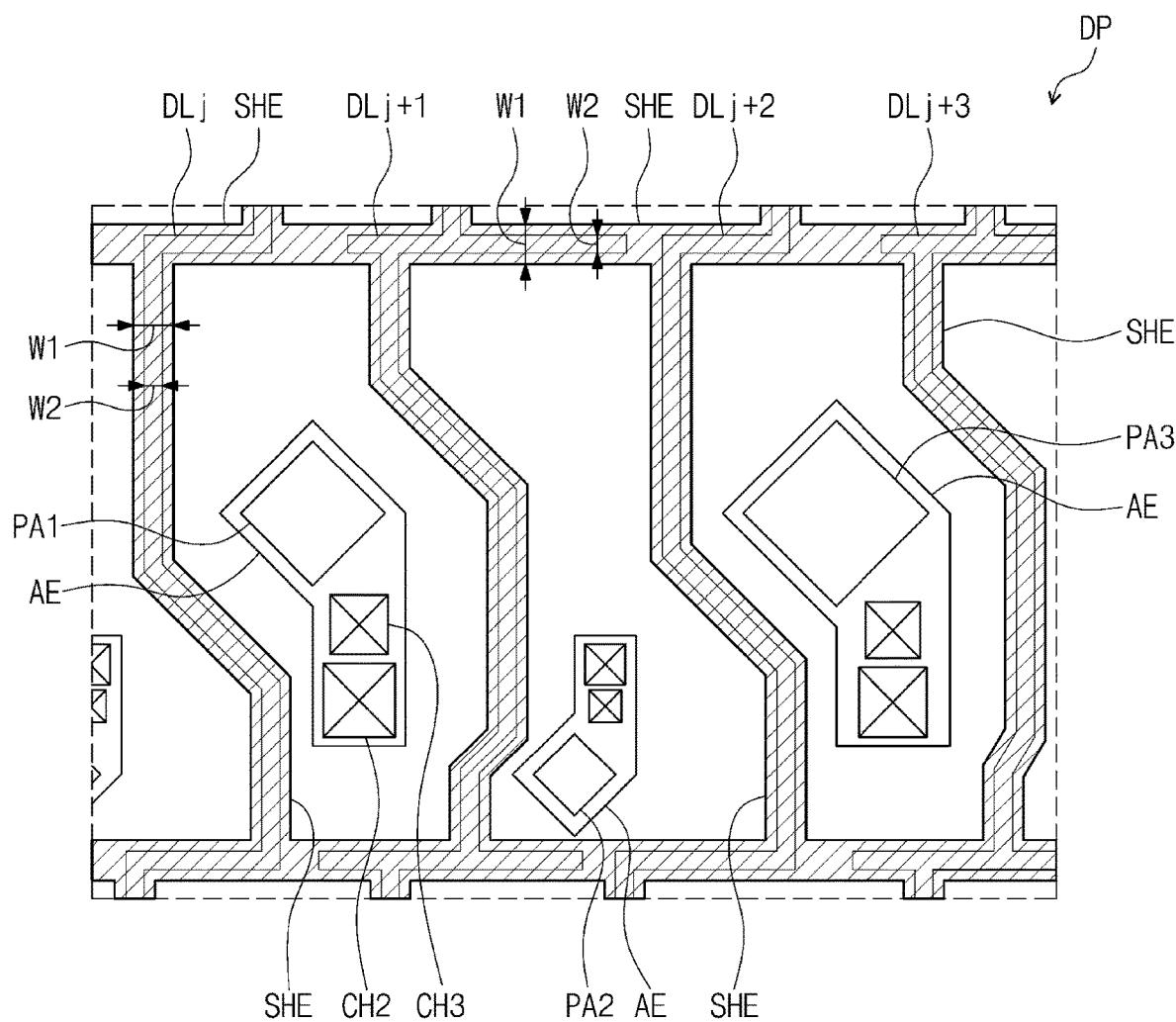
FIG. 11 illustrates a plan view partially of the display panel depicted in FIG. 4.

FIG. 11 illustrates a plan view partially of the display panel depicted in FIG. 4.

FIG. 11 exemplarily illustrates a plane around a first emission area PA1, a second emission area PA2, and a third emission area PA3.

Referring to FIG. 11, data lines DLj, DLj+1, DLj+2, and DLj+3 may be arranged in the second direction DR2, while being spaced apart from the first, second, and third emission areas PA1, PA2, and PA3. Therefore, the data lines DLj, DLj+1, DLj+2, and DLj+3 may be spaced apart from the light emitting elements OLED disposed on the first, second, and third emission areas PA1, PA2, and PA3. The data lines DLj, DLj+1, DLj+2, and DLj+3 may be spaced apart from each other, while extending in both the first and second directions DR1 and DR2.

The first, second, and third emission areas PA1, PA2, and PA3 may each be disposed between ones of the data lines DLj, DLj+1, DLj+2, and DLj+3. The first emission area PA1 may be disposed between the data lines DLj and DLj+1. The second emission area PA2 may be disposed between the data lines DLj+1 and DLj+2. The third emission area PA3 may be disposed between the data lines DLj+2 and DLj+3.

The first electrodes AE may each be disposed between ones of the data lines DLj, DLj+1, DLj+2, and DLj+3. The first electrodes AE may extend in the first direction DR1, while overlapping the emission areas PA1, PA2, and PA3. FIG. 11 exemplarily illustrates the second and third contact holes CH2 and CH3 that overlap the first electrodes AE, when viewed in plan.

The first emission area PA1, second emission area PA2, and third emission area PA3 may be of different sizes. Correspondingly, contact holes CH2 and CH3 that correspond to the different size emission areas PA1, PA2, and PA3 may also be of different sizes, as may be the first electrodes AE.

In some embodiments of the present invention, the display panel DP may include a shield electrode SHE that overlaps the data lines DLj, DLj+1, DLj+2, and DLj+3, when viewed in plan. The shield electrode SHE may extend along the data lines DLj, DLj+1, DLj+2, and DLj+3. FIG. 11 exemplarily illustrates a diagonal hatching to indicate the shield electrode SHE.

The shield electrode SHE may be formed to have a single body including pieces which are spaced apart from each other across the first, second, and third emission areas PA1, PA2, and PA3 and which extend in the first and second directions DR1 and DR2. Therefore, when viewed in plan, the shield electrode SHE may be disposed to surround the first, second, and third emission areas PA1, PA2, and PA3. In addition, when viewed in plan, the shield electrode SHE may be placed to surround the first electrodes AE.

The shield electrode SHE may be spaced apart and insulated from the first electrodes AE. When viewed in plan, the shield electrode SHE may have a width W1 greater than a width W2 of each of the data lines DLj, DLj+1, DLj+2, and DLj+3. This, however, is merely exemplary. When viewed in plan, the shield electrode SHE may have the same width as that of each of the data lines DLj, DLj+1, DLj+2, and DLj+3.

The width W1 may be defined to indicate a width in the second direction DR2 of a portion of the shied electrode SHE, which portion extends in the first direction DR1. In addition, the width W1 may be defined to indicate a width in the first direction DR1 of another portion of the shield electrode SHE, which another portion extends in the second direction DR2.

The width W2 may be defined to indicate a width in the second direction DR2 of a portion of each of the data lines DLj, DLj+1, DLj+2, and DLj+3, which portion extends in the first direction DR1. In addition, the width W2 may be defined to indicate a width in the first direction DR1 of another portion of each of the data lines DLj, DLj+1, DLj+2, and DLj+3, which another portion extends in the second direction DR2.

When viewed in plan, the shield electrode SHE may be disposed to extend to a location adjacent to an edge of each of the data lines DLj, DLj+1, DLj+2, and DLj+3. The shield electrode SHE may be located at the same level as that of the first electrodes AE, and this configuration will be further discussed in detail with reference to FIG. 12.

Figure 12:
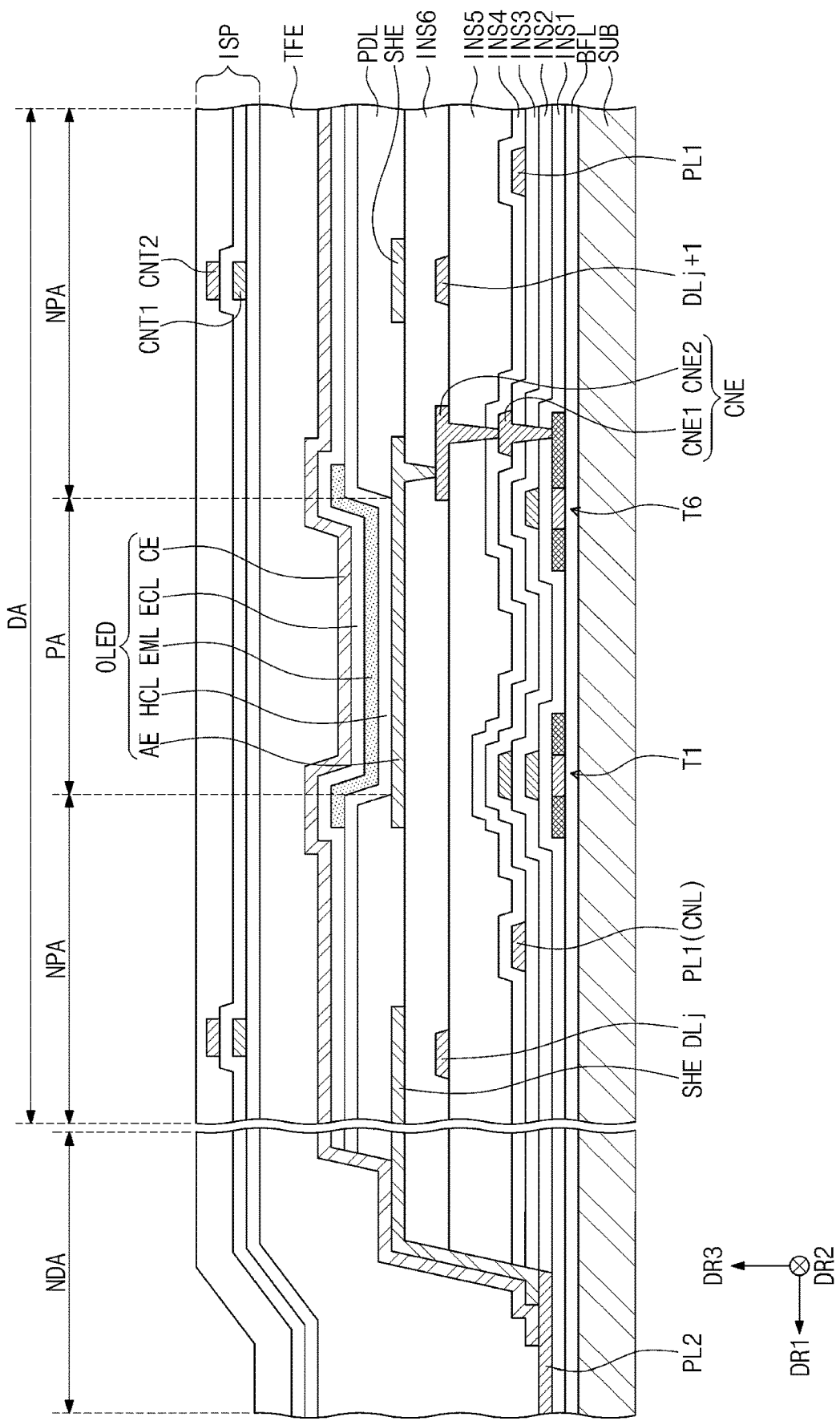
FIG. 12 illustrates a cross-sectional view exemplarily of one emission area and its adjacent region depicted in FIG. 11.

FIG. 12 illustrates a cross-sectional view exemplarily of one emission area and its adjacent region depicted in FIG. 11.

Referring to FIG. 12, the first power lines PL1 may be disposed on the third dielectric layer INS3, and the fourth dielectric layer INS4 may be disposed on the first power lines PL1. The first power lines PL1 are omitted from the plan view of FIG. 11. For example, the first power lines PL1 of FIG. 12 may be the connection lines CNL that extend from the first power line PL1 of FIG. 4. In the following, the connection lines CNL are referred to as the first power lines PL1.

The first power lines PL1 may be located at the same level as that of the first connection electrode CNE1. As discussed above, the first power line PL1 may receive the first voltage ELVDD configured for being applied to the first electrode AE. The first power line PL1 may be formed of the same material as that of the first connection electrode CNE1, and may be formed by being patterned simultaneously with the first connection electrode CNE1.

The data lines DLj and DLj+1 may be disposed on the fifth dielectric layer INS5, and the sixth dielectric layer INS6 may be disposed on the data lines DLj and DLj+1. The data lines DLj and DLj+1 may be disposed at the same level as that of the connection electrode CNE. For example, the data lines DLj and DLj+1 may be disposed at the same level as that of the second connection electrode CNE2. The data lines DLj and DLj+1 may be formed of the same material as that of the second connection electrode CNE2, and may be formed by being patterned simultaneously with the second connection electrode CNE2.

The shield electrode SHE may be disposed on the sixth dielectric layer INS6, and the pixel definition layer PDL may be disposed on the shield electrode SHE. The shield electrode SHE may be disposed on and overlap the data lines DLj and DLj+1. The shield electrode SHE may be located at the same level as that of the first electrode AE. The shield electrode SHE may be formed of the same material as that of the first electrode AE, and may be formed by being patterned simultaneously with the first electrode AE.

The buffer layer BFL and the first dielectric layer INS1 may extend toward the non-display area NDA. The second to sixth dielectric layers INS2 to INS6 and the pixel definition layer PDL may extend to a portion of the non-display area NDA.

On the non-display area NDA, the second power line PL2 may be disposed on the first dielectric layer INS1. As discussed above, the second power line PL2 may receive the second voltage ELVSS configured for being applied to the second electrode CE. The second power line PL2 may be formed of the same material as that of the gates G1 and G6, and may be formed by being patterned simultaneously with the gates G1 and G6.

The second electrode CE may extend toward the non-display area NDA to have connection with the second power line PL2. The shield electrode SHE may extend toward the non-display area NDA to have connection with the second power line PL2. The shield electrode may be coplanar with the third insulating layer INS3 and extend over the sixth insulating layer INS6, coplanar and within the pixel definition layer PDL. Therefore, the second voltage ELVSS may be applied to the shield electrode SHE. The shield electrode SHE may extend toward the non-display area NDA to also have electrical connection with the second electrode CE. The shield electrode SHE may extend toward an edge of the second electrode CE to have connection with the second electrode CE.

On the non-display area NDA, the shield electrode SHE may be disposed below and coplanar with the second electrode CE. In addition, on the non-display area NDA, the shield electrode SHE may be disposed on the second power line PL2.

The input sensing part ISP may be disposed on the light emitting element OLED. A first conductive pattern CNT1 including the connection pattern CP may overlap the non-emission area NPA, and a second conductive pattern CNT2 including the first and second sensing parts SP1 and SP2 may overlap the non-emission area NPA. When viewed in plan, the first conductive pattern CNT1 and the second conductive pattern CNT2 may overlap the shield electrode SHE in the third direction DR3.

Portions of the shield electrode SHE may be disposed between the data lines DLj and DLj+1 and the first and second conductive patterns CNT1 and CNT2. The first voltage ELVDD and the second voltage ELVSS may each be a direct voltage.

Signals applied to the data lines DLj and DLj+1 may affect signals applied to the first and second conductive patterns CNT1 and CNT2. Inversely, signals applied to the first and second conductive patterns CNT1 and CNT2 may affect signals applied to the data lines DLj and DLj+1. This phenomenon may be defined as signal interference, and the signal interference may generate noise to the display device DD.

When the shield electrode SHE supplied with a direct voltage or the second voltage ELVSS is disposed between the data lines DLj and DLj+1 and the first and second conductive patterns CNT1 and CNT2, the shield electrode SHE may reduce the signal interference. Accordingly, it may be possible to reduce noise caused by signal interference.

Figure 13:
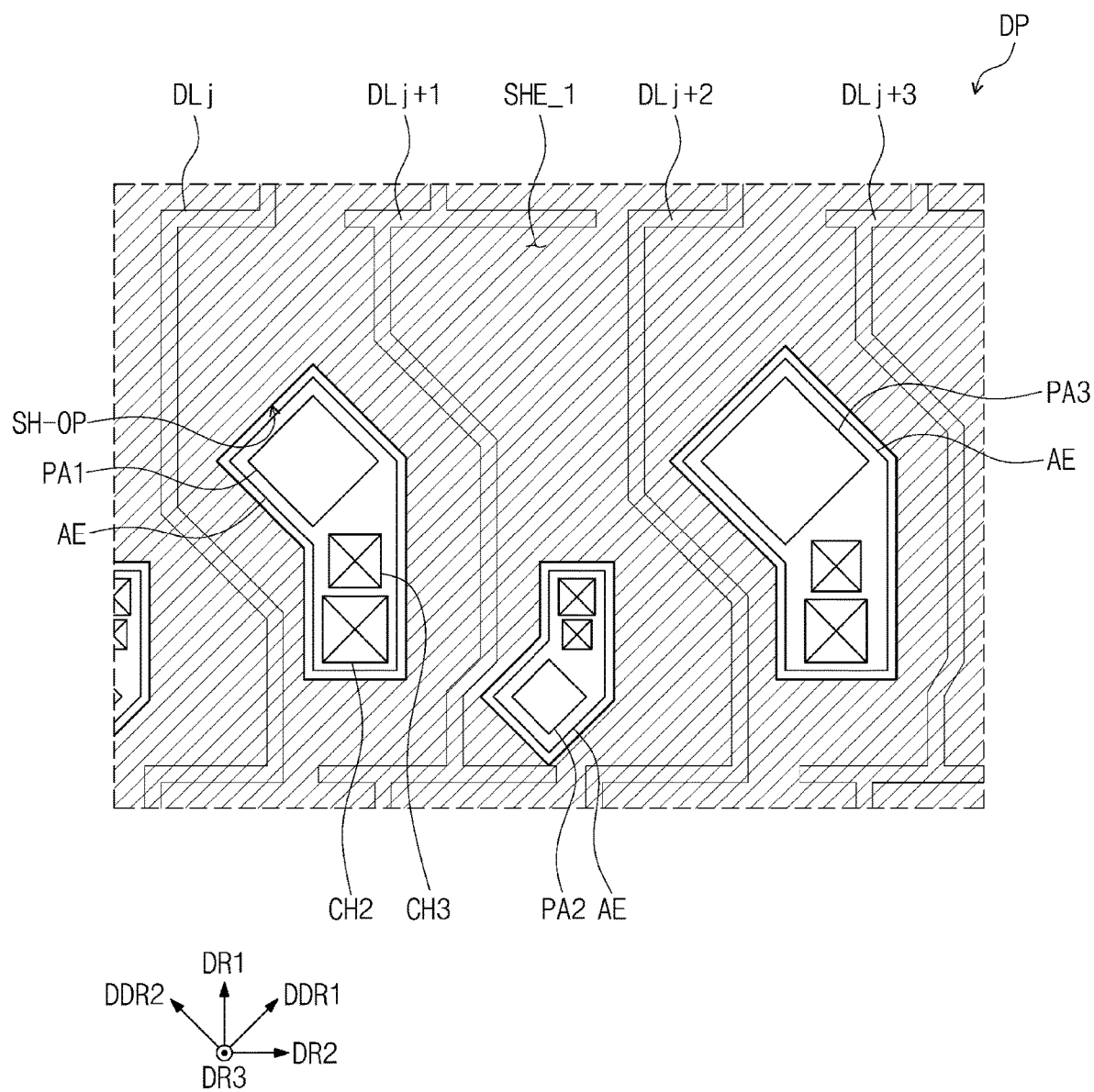
FIG. 13 illustrates a plan view partially of a display panel according to some embodiments of the present invention.
Figure 14:
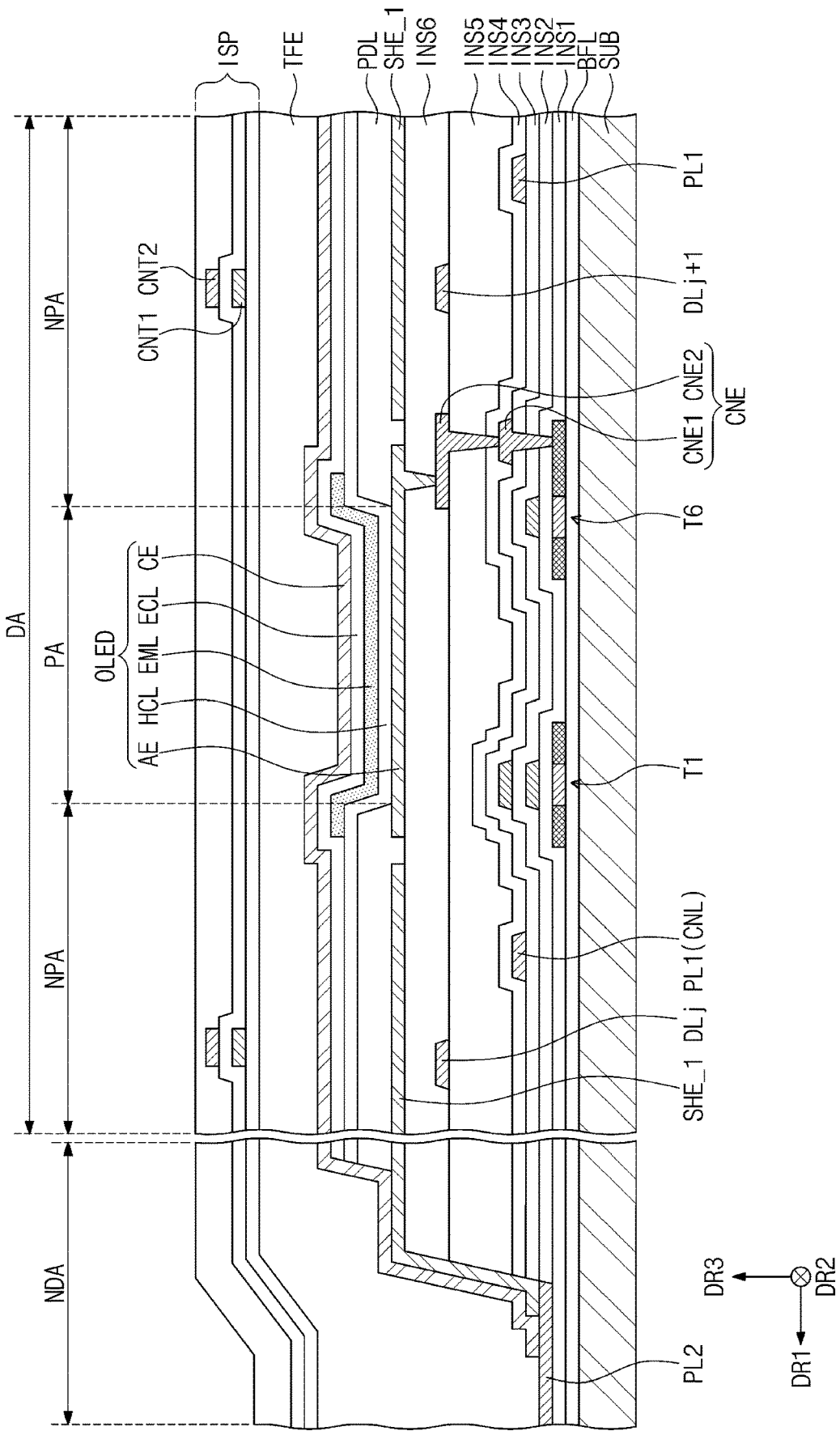
FIG. 14 illustrates a cross-sectional view exemplarily of one emission area and its adjacent region depicted in FIG. 13.

FIG. 13 illustrates a plan view partially of a display panel according to some embodiments of the present invention. FIG. 14 illustrates a cross-sectional view exemplarily of one emission area and its adjacent region depicted in FIG. 13.

FIG. 13 exemplarily illustrates a plan view that corresponds to that of FIG. 11, and FIG. 14 exemplarily illustrates a cross-sectional view that corresponds to that of FIG. 12. With reference to FIGS. 13 and 14, the following will note components different from those illustrated in FIGS. 11 and 12. The same components are allocated the same reference symbols.

Referring to FIG. 13, when viewed in plan, a shield electrode SHE_1 may be disposed to extend to a location adjacent to each of the first electrodes AE. The first, second, and third emission areas PA1, PA2, and PA3 and the first electrodes AE may be disposed in openings SH-OP defined by the shield electrode SHE_1. The shield electrode SHE_1 may have a planar area greater than that of the shield electrode SHE illustrated in FIGS. 11 and 12.

Referring to FIG. 14, the shield electrode SHE_1 may be disposed in the first direction DR1 and third direction between the data lines DLj and DLj+1 and the first and second conductive patterns CNT1 and CNT2, which may result in a reduction in noise caused by signal interference.

Figure 15:
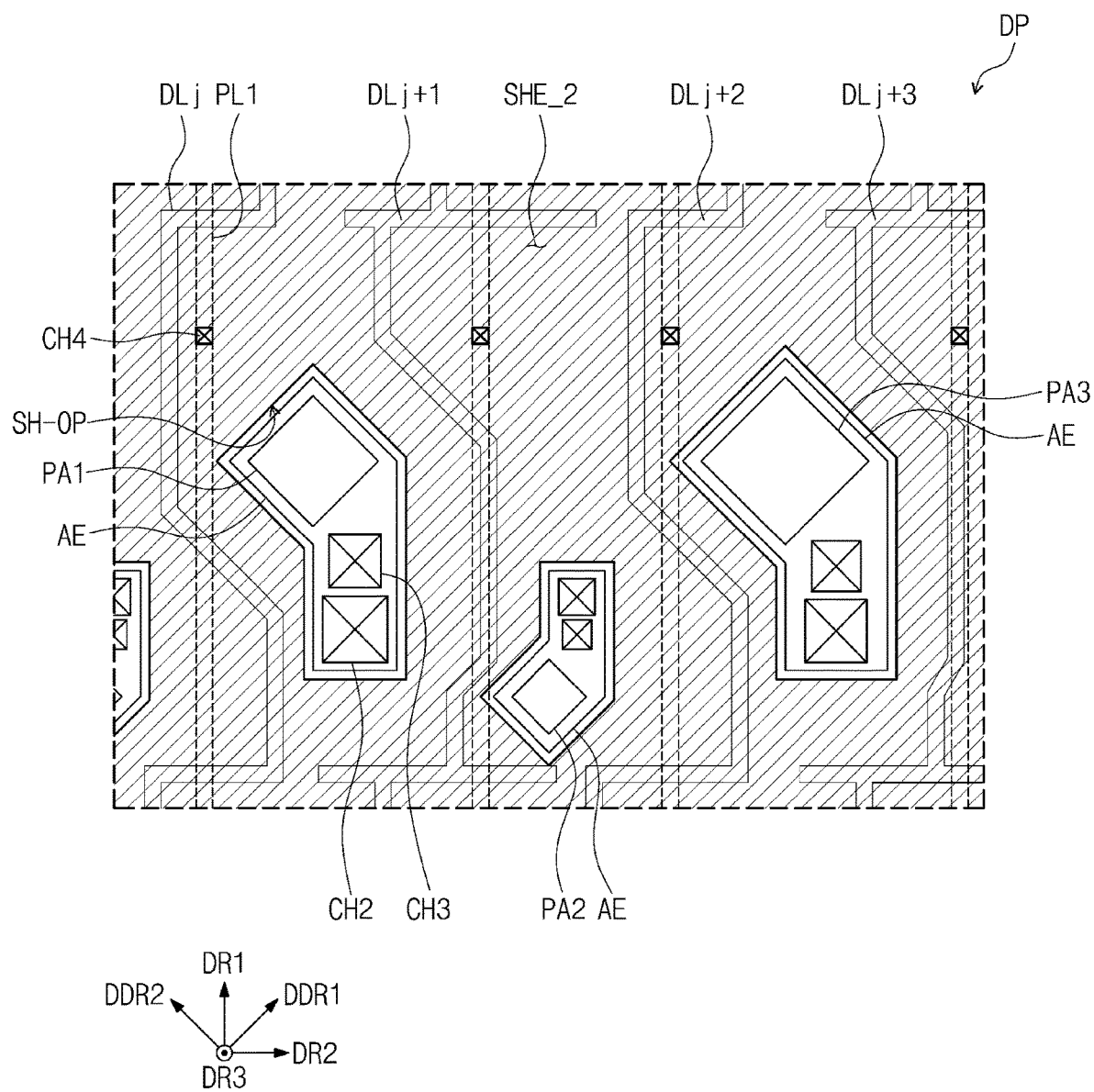
FIG. 15 illustrates a plan view partially of a display panel according to some embodiments of the present invention.
Figure 16:
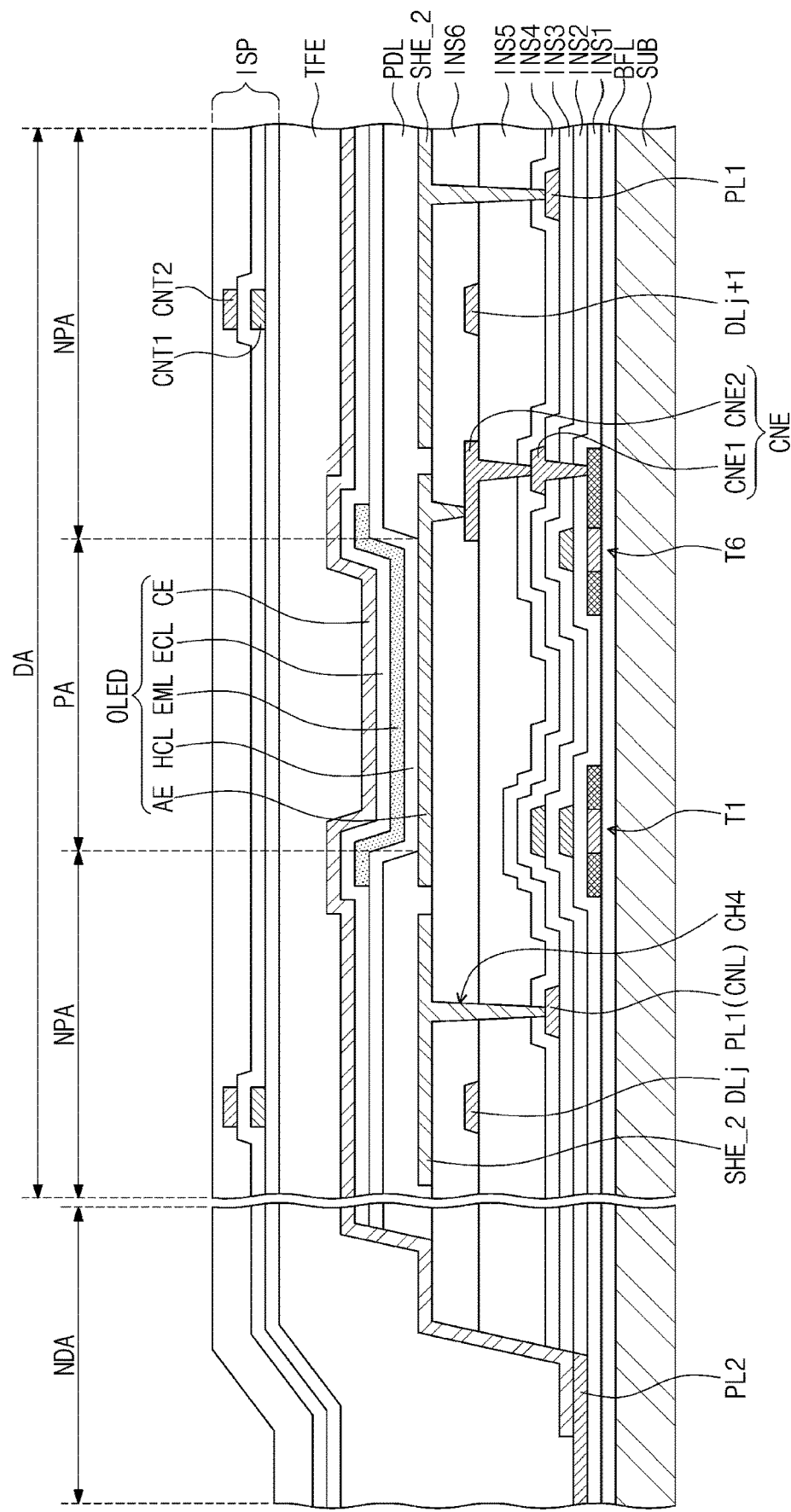
FIG. 16 illustrates a cross-sectional view exemplarily of one emission area and its adjacent region depicted in FIG. 15.

FIG. 15 illustrates a plan view partially of a display panel according to some embodiments of the present invention. FIG. 16 illustrates a cross-sectional view exemplarily of one emission area and its adjacent region depicted in FIG. 15.

FIG. 15 exemplarily illustrates a plan view that corresponds to that of FIG. 11, and FIG. 16 exemplarily illustrates a cross-sectional view that corresponds to that of FIG. 12. With reference to FIGS. 15 and 16, the following will note components different from those illustrated in FIGS. 11 and 12.

Referring to FIG. 15, when viewed in plan, a shield electrode SHE_2 may be disposed to extend to a location adjacent to each of the first electrodes AE. The shield electrode SHE_2 may have a planar area the same as that of the shield electrode SHE_1 illustrated in FIGS. 13 and 14.

The first power lines PL1 may be disposed to extend in the first direction DR1 of FIG. 15 and to overlap the shield electrode SHE_2 in various places. FIG. 15 exemplarily illustrates dotted lines to indicate the first power lines PL1. The number of first power lines PL1 may be correspondingly adjacent to the data lines DLj, DLj+1, DLj+2, and DLj+3.

Referring to FIG. 16, the shield electrode SHE_2 may be connected to the first power lines PL1 through fourth contact holes CH4 defined in the fourth, fifth, and sixth dielectric layers INS4, INS5, and INS6. In this and other embodiments, the shield electrode SHE_2 may not be connected to the second power line PL2. Therefore, the shield electrode SHE_2 may be supplied with the first voltage ELVDD through the first power lines PL1.

When the shield electrode SHE_2 supplied with a direct voltage or the first voltage ELVDD is disposed between the data lines DLj and DLj+1 and the first and second conductive patterns CNT1 and CNT2, signal interference may be reduced due to the shield electrode SHE_2 and thus noise may be decreased.

Figure 17:
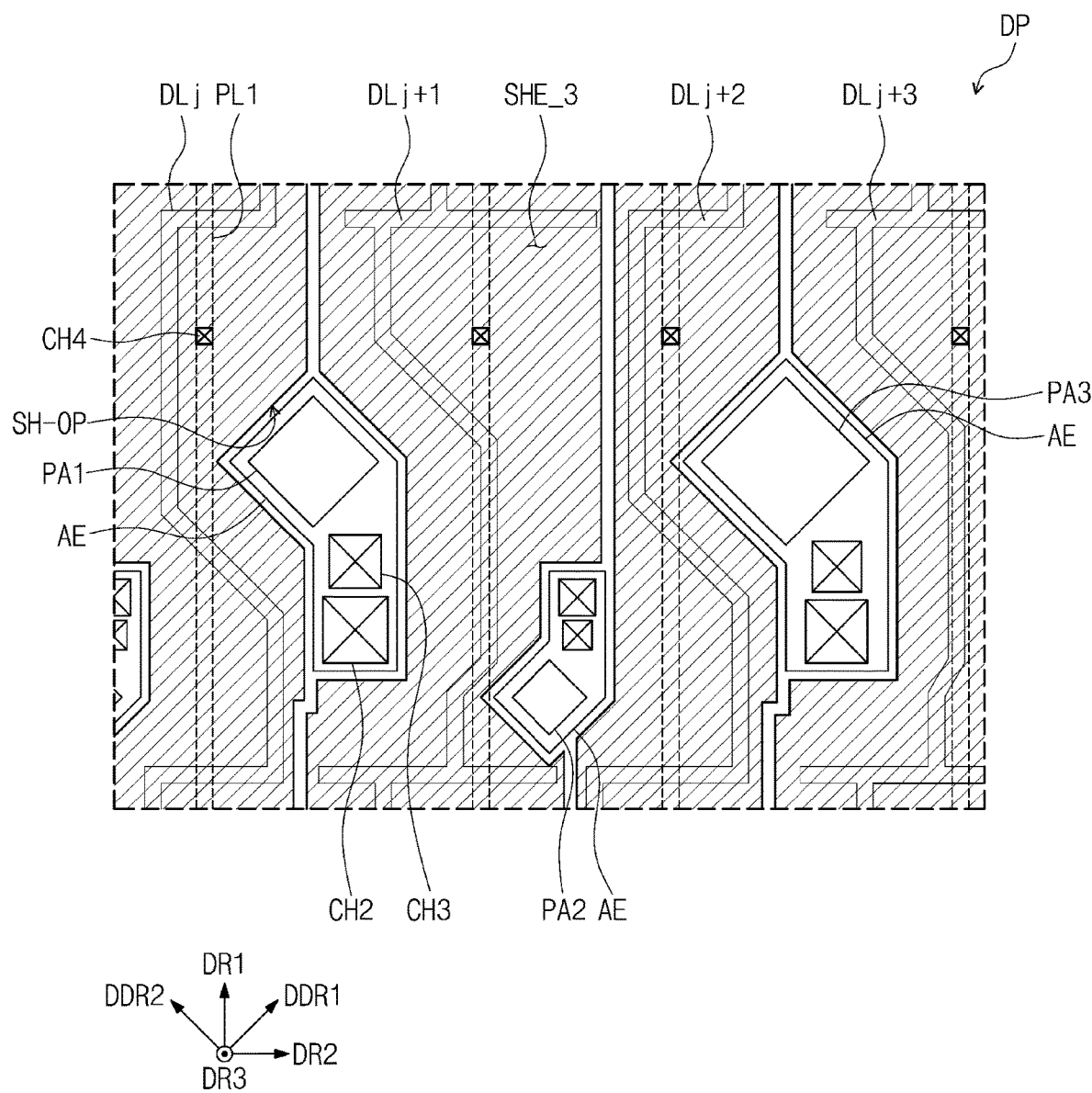
FIG. 17 illustrates a plan view partially of a display panel according to some embodiments of the present invention.

FIG. 17 illustrates a plan view partially of a display panel according to some embodiments of the present invention.

FIG. 17 exemplarily illustrates a plan view that corresponds to that of FIG. 11. With reference to FIG. 17, the following will note components different from those illustrated in FIG. 11.

Referring to FIG. 17, when viewed in plan, a plurality of shield electrodes SHE_3 separated from each other in the second direction DR2 may be disposed to overlap corresponding first power lines PL1 in various places. The first, second, and third emission areas PA1, PA2, and PA3 and the first electrodes AE may be disposed between the shield electrodes SHE_3. The shield electrodes SHE_3 may be disposed to extend to a location adjacent to the first electrodes AE.

The shield electrodes SHE_3 may be connected through fourth contact holes CH4 to the first power lines PL1. A configuration where the shield electrodes SHE_3 are connected to the first power lines PL1 may be substantially the same as a configuration where the shield electrodes SHE_2 are connected to the first power lines PL1 illustrated in FIG. 16.

Although a cross-section is not illustrated, likewise the shield electrode SHE_2, the shield electrodes SHE_3 may be disposed between the data lines DLj and DLj+1 and the first and second conductive patterns CNT1 and CNT2, thereby reducing noise caused by signal interference.

Figure 18:
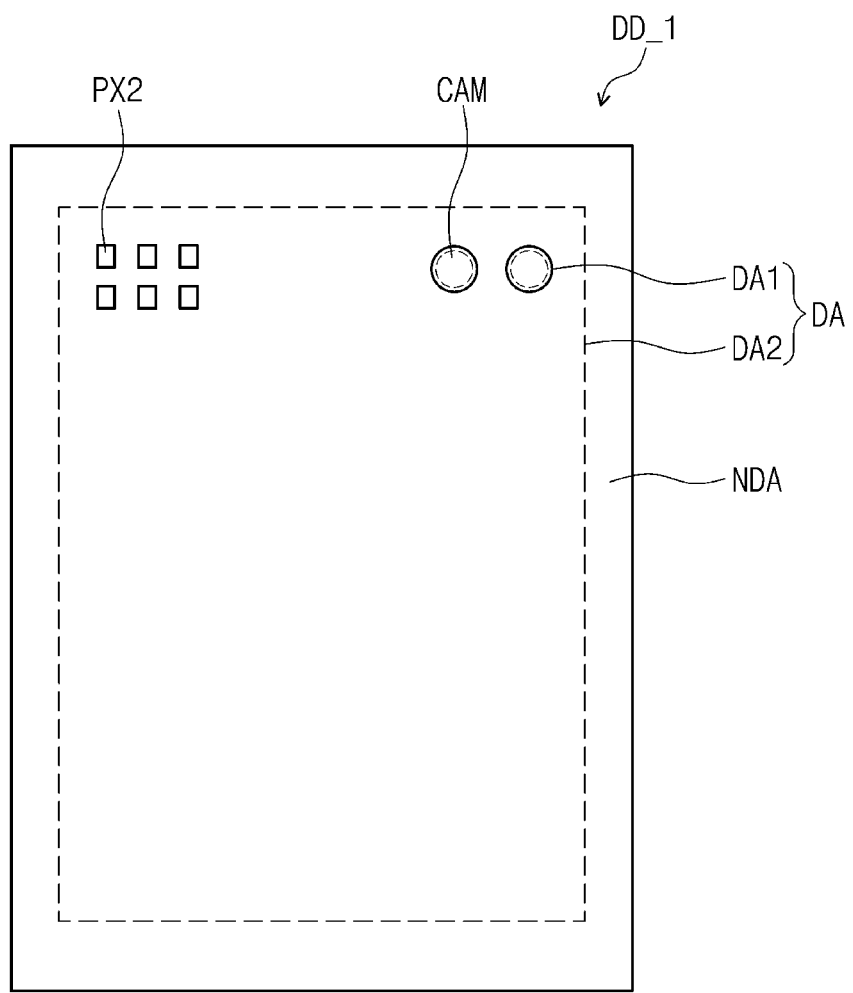
FIG. 18 illustrates a plan view of a display device according to some embodiments of the present invention.
Figure 19:
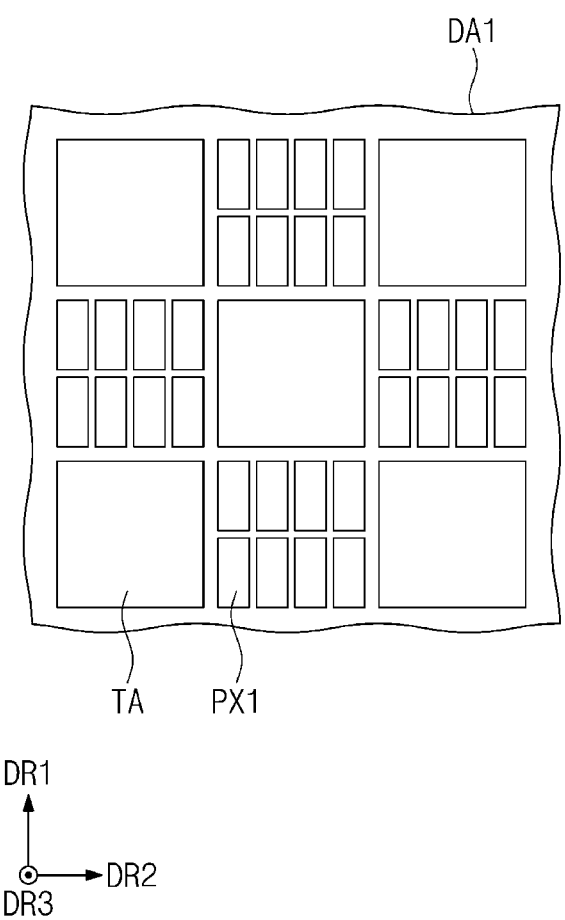
FIG. 19 illustrates a plan view partially of a first display area depicted in FIG. 18.

FIG. 18 illustrates a plan view of a display device according to some embodiments of the present invention. FIG. 19 illustrates a plan view partially of a first display area depicted in FIG. 18.

Referring to FIGS. 18 and 19, a display device DD_1 may include a display area DA and a non-display area NDA around the display area DA. The non-display area NDA may surround the display area DA. The display area DA may include first display areas DA1 and a second display area DA2 around the first display areas DA1. The second display area DA2 may surround the first display areas DA1.

At least one camera CAM may be disposed on the first display areas DA1. In addition, a plurality of first pixels PX1 may be disposed on the first display areas DA1. The first display areas DA1 may have a plurality of transmission areas TA on which the first pixels PX1 are not disposed. The transmission areas TA may be arranged along the first and second directions DR1 and DR2. The first pixels PX1 may be disposed around corresponding transmission areas TA. For example, the first pixels PX1 may be disposed between the transmission areas TA.

A plurality of second pixels PX2 may be disposed on the second display area DA2. A configuration of the second pixels PX2 may be substantially the same as a configuration of the first pixels PX1.

Figure 20:
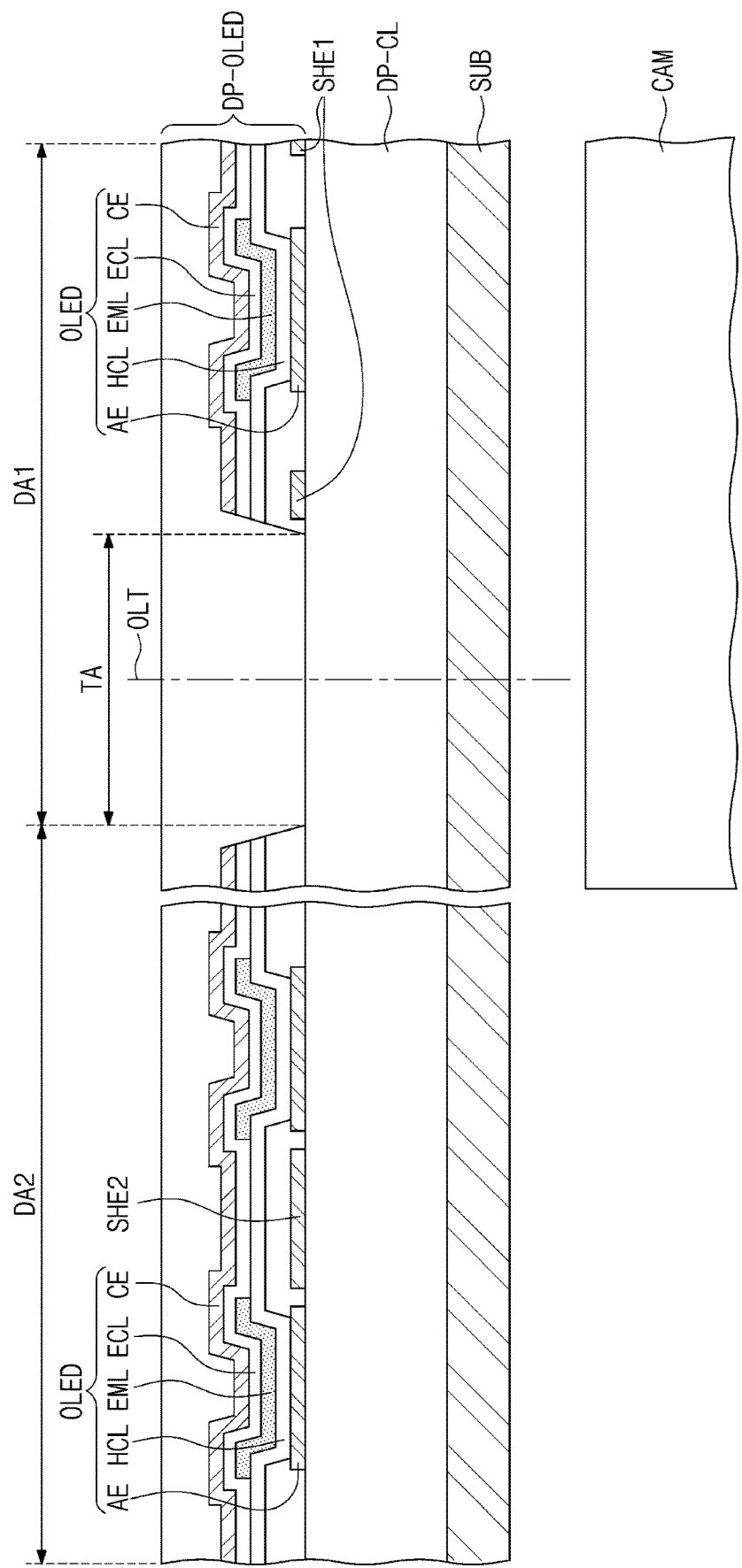
FIG. 20 illustrates a cross-sectional view partially of a first display area and a second display area depicted in FIG. 18.
Figure 21:
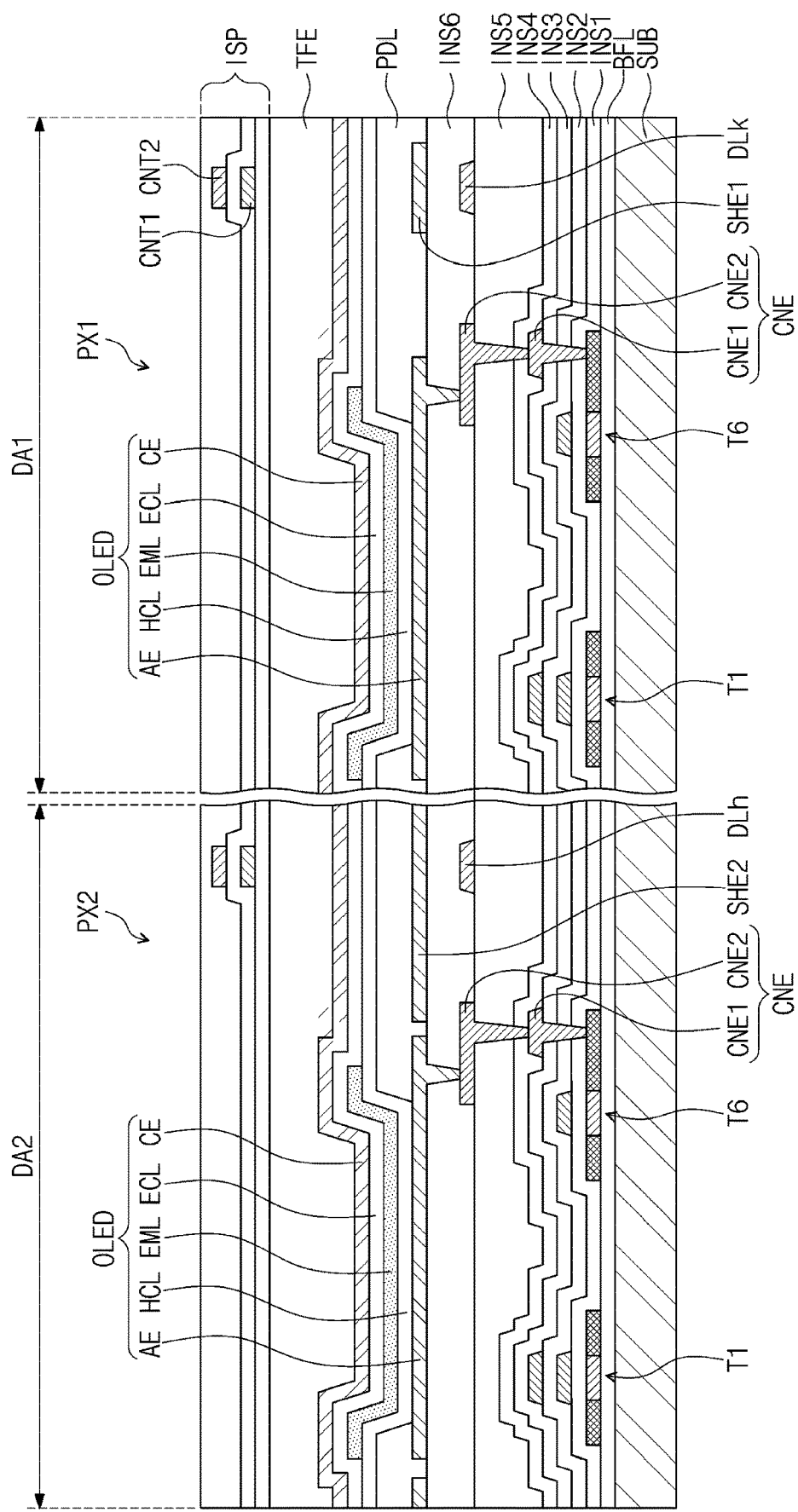
FIG. 21 illustrates a cross-sectional view of first and second pixels depicted in FIG. 20.

FIG. 20 illustrates a cross-sectional view partially of the first display area and the second display area depicted in FIG. 18. FIG. 21 illustrates a cross-sectional view of the first and second pixels depicted in FIG. 20.

In FIG. 20, the circuit element layer DP-CL is exemplarily illustrated in the form of a single layer.

Referring to FIG. 20, the camera CAM may be disposed below the first display area DA1. The light emitting element OLED may not be disposed on the transmission area TA. The light emitting element OLED on the first display area DA1 may display an image. In addition, the camera CAM may be provided through the transmission area TA with an external light OLT to capture an external image.

On the first display area DA1, a first shield electrode SHE1 may be disposed on the circuit element layer DP-CL. On the second display area DA2, a second shield electrode SHE2 may be disposed on the circuit element layer DP-CL.

Referring to FIGS. 20 and 21, the first and second shield electrodes SHE1 and SHE2 may have a width greater than that of data lines DLh and DLk. The first shield electrode SHE1 may be disposed to extend to a location adjacent to an edge of the data line DLk. The subscriptions "h" and "k" are natural numbers. The first shield electrode SHE1 may be substantially the same as the shield electrode SHE illustrated in FIGS. 11 and 12.

The second shield electrode SHE2 may be disposed to extend to a location adjacent to the first electrode AE of the second pixel PX2. The second shield electrode SHE2 may be substantially the same as the shield electrode SHE_1 illustrated in FIGS. 13 and 14. Therefore, the second shield electrode SHE2 may have a planar area greater than that of the first shield electrode SHE1.

The external light OLT may be provided to the camera CAM on the first display area DA1. When the first shield electrode SHE1 is configured to be a similar size as the second shield electrode SHE2, the first shield electrode SHE1 may reduce a transmittance of the external light OLT. In some embodiments of the present invention, as the first shield electrode SHE1 is disposed to a location adjacent to the edge of the data line DLk, the external light OLT may be prevented from its transmittance reduction due to the first shield electrode SHE1.

The first pixels PX1 may be disposed on the first display area DA1, but in order to increase a transmittance of light, the first pixels PX1 may not be disposed on the first display area DA1. In this case, the first shield electrode SHE1 may not be disposed on the first display area DA1, and only the second shield electrode SHE2 may be disposed on the second display area DA2.

According to some embodiments of the present invention, a shield electrode is disposed between data lines and sensing parts in order to reduce noise caused by signal interference.

Although the present invention is described in conjunction with some example embodiments thereof, it would be understood by those skilled in the art that the present invention can be modified or changed in various ways without departing from spirit and scope of the present invention defined by the appended claims. Further, the embodiments disclosed herein are not intended to limit the technical spirit of the present invention and all technical spirit within the claims and their equivalents should be construed as being included in the present invention.

What is claimed is:

1. A display device, comprising:
   a transistor;
   a light emitting element disposed on the transistor, the light emitting element including a first electrode, a second electrode on the first electrode, and an emission layer between the first electrode and the second electrode;
   a data line spaced apart from the light emitting element; and
   a shield electrode disposed at a same level of the first electrode, wherein, when viewed in a plan view, the shield electrode overlaps the data line and extends along the data line,
   wherein, when viewed in the plan view, the shield electrode is disposed to surround the first electrode.

2. The display device of claim 1, wherein, when viewed in the plan view, a width of the shield electrode is the same as or greater than a width of the data line.

3. The display device of claim 2, wherein, when viewed in the plan view, the shield electrode is disposed to a location adjacent to an edge of the data line.

4. The display device of claim 2, wherein, when viewed in the plan view, the shield electrode is disposed to a location adjacent to the first electrode.

5. The display device of claim 1, further comprising a sensing part disposed above the light emitting element,
   wherein the shield electrode is disposed between the sensing part and the data line.

6. The display device of claim 1, further comprising a connection electrode disposed between the transistor and the light emitting element, the connection electrode connecting the transistor to the first electrode,
   wherein the connection electrode includes:
   a first connection electrode on the transistor and connected to the transistor; and
   a second connection electrode disposed between the first connection electrode and the first electrode, the second connection electrode connected to the first connection electrode and the first electrode.

7. The display device of claim 6, wherein the data line is disposed at a level the same as a level of the second connection electrode.

8. The display device of claim 6, further comprising:
   a first power line that receives a first voltage to be applied to the first electrode; and
   a second power line that receives a second voltage to be applied to the second electrode, the second voltage being less than the first voltage,
   wherein the first power line is disposed at a level the same as a level of the first connection electrode.

9. The display device of claim 8, wherein the shield electrode is connected to the second power line.

10. The display device of claim 8, wherein the shield electrode is connected to the second power line and the second electrode.

11. The display device of claim 8, wherein the shield electrode is connected to the first power line.

12. The display device of claim 11, wherein
the light emitting element is provided in plural,
the shield electrode is provided in plural, and
the plurality of shield electrodes are disposed to a location adjacent to the first electrodes of the plurality of light emitting elements.

13. The display device of claim 1, further comprising:
a first display area that includes a transmission area and a first pixel around the transmission area; and
a second display area around the first display area, the second display area including a second pixel,
wherein each of the first and second pixels includes the transistor and the light emitting element.

14. The display device of claim 13, wherein, when viewed in the plan view, in the first display area, a width of the shield electrode is greater than a width of the data line, and the shield electrode is disposed to a location adjacent to an edge of the data line.

15. The display device of claim 14, wherein, when viewed in the plan view, in the second display area, the shield electrode is disposed to a location adjacent to the first electrode.

16. A display device, comprising:
a transistor;
a light emitting element disposed on the transistor, the light emitting element including a first electrode, a second electrode on the first electrode, and an emission layer between the first electrode and the second electrode;
a data line spaced apart from the light emitting element; and
a shield electrode that is disposed at a same level of the first electrode and overlaps the data line in a plan view,
wherein:
the shield electrode extends to an edge of the second electrode and is connected to the second electrode; and
when viewed in the plan view, the shield electrode is disposed to surround the first electrode.

17. The display device of claim 16, wherein, when viewed in the plan view, a width of the shield electrode is the same as or greater than a width of the data line.

18. A display device, comprising:
a first display area that includes a transmission area and a first pixel around the transmission area;
a second display area around the first display area, the second display area including a second pixel;
a plurality of data lines connected to the first and second pixels; and
a shield electrode disposed on the data lines,
wherein each of the first and second pixels includes:
a transistor; and
a light emitting element disposed on the transistor, the light emitting element including a first electrode, a second electrode on the first electrode, and an emission layer between the first electrode and the second electrode,
wherein the shield electrode is disposed at a same level of the first electrode and overlaps the data line in a plan view, and
wherein, when viewed in the plan view, a planar area of the shield electrode in the second display area is greater than a planar area of the shield electrode in the first display area.

19. The display device of claim 18, wherein
on the first display area, the shield electrode is disposed to a location adjacent to an edge of the data line, and
on the second display area, the shield electrode is disposed to a location adjacent to the first electrode.

* * * * *